(12) United States Patent
Hosseini et al.

(10) Patent No.: US 9,296,066 B2
(45) Date of Patent: Mar. 29, 2016

(54) METHOD OF MATERIAL PROCESSING BY LASER FILAMENTATION

(75) Inventors: S. Abbas Hosseini, Richmond Hill (CA); Peter R. Herman, Toronto (CA)

(73) Assignee: ROFIN-SINAR TECHNOLOGIES INC., Plymouth, MI (US)

( * ) Notice: Subject to any disclaimer, the term of this patent is extended or adjusted under 35 U.S.C. 154(b) by 538 days.

(21) Appl. No.: 13/640,140

(22) PCT Filed: Jul. 12, 2011

(86) PCT No.: PCT/CA2011/050427
§ 371 (c)(1),
(2), (4) Date: Jan. 31, 2013

(87) PCT Pub. No.: WO2012/006736
PCT Pub. Date: Jan. 19, 2012

(65) Prior Publication Data
US 2013/0126573 A1 May 23, 2013

Related U.S. Application Data

(60) Provisional application No. 61/363,568, filed on Jul. 12, 2010, provisional application No. 61/372,967, filed on Aug. 12, 2010.

(51) Int. Cl.
*B23K 26/00* (2014.01)
*B23K 26/06* (2014.01)
(Continued)

(52) U.S. Cl.
CPC ......... *B23K 26/0057* (2013.01); *B23K 26/0006* (2013.01); *B23K 26/0604* (2013.01);
(Continued)

(58) Field of Classification Search
CPC .......... B23K 26/0039; B23K 26/0057; B23K 26/0604; B23K 26/0621; B23K 26/0635; H01L 21/2633
USPC ............. 219/121.67, 121.69, 121.72, 121.85; 428/187, 426; 438/33, 113, 426, 458
See application file for complete search history.

(56) References Cited

U.S. PATENT DOCUMENTS 6,407,360 B1 * 6/2002 Choo et al. ............... 219/121.67
6,552,301 B2   4/2003 Herman et al.
(Continued)

FOREIGN PATENT DOCUMENTS

JP     2007238438    9/2007
JP      200972829    4/2009
(Continued)

OTHER PUBLICATIONS

Nguyen, N. T. et al., "Optical breakdown versus filamentation in fused silica by use of femtosecond infrared laser pulses", Opt. Lett. 28(17), 1591 (2003).
(Continued)

*Primary Examiner* — Thien S Tran
(74) *Attorney, Agent, or Firm* — Lynn C. Schumacher; Stephen W. Leonard; Hill & Schumacher

(57) ABSTRACT

A method is provided for the internal processing of a transparent substrate in preparation for a cleaving step. The substrate is irradiated with a focused laser beam that includes pulses having an energy and pulse duration selected to produce a filament within the substrate. The substrate is translated relative to the laser beam to irradiate the substrate and produce an additional filament at one or more additional locations. The resulting filaments form an array defining an internally scribed path for cleaving the substrate. Laser beam parameters may be varied to adjust the filament length and position, and to optionally introduce V-channels or grooves. The laser pulses may be delivered in a burst train for lowering the energy threshold for filament formation, increasing filament length, thermally annealing of the filament modification zone to minimize collateral damage, and increasing the processing speed compared with the use of low repetition rate lasers.

31 Claims, 27 Drawing Sheets

(51) Int. Cl.
  *B26F 3/00* (2006.01)
  *H01L 21/263* (2006.01)
  *C03B 33/02* (2006.01)

(52) U.S. Cl.
  CPC ......... *B23K26/0619* (2015.10); *B23K 26/0624* (2015.10); *B26F 3/00* (2013.01); *C03B 33/0222* (2013.01); *H01L 21/2633* (2013.01); *B23K 2203/50* (2015.10); *Y10T 225/12* (2015.04)

(56) References Cited

U.S. PATENT DOCUMENTS

| | | | |
|---|---|---|---|
| 6,787,732 | B1 | 9/2004 | Xuan et al. |
| 6,992,026 | B2 | 1/2006 | Fukuyo et al. |
| 7,303,977 | B2 | 12/2007 | Voronov et al. |
| 2002/0125232 | A1 | 9/2002 | Choo et al. |
| 2003/0006221 | A1* | 1/2003 | Hong et al. ............. 219/121.72 |
| 2006/0011593 | A1* | 1/2006 | Fukuyo et al. ............ 219/121.67 |
| 2006/0213883 | A1 | 9/2006 | Eberhardt et al. |
| 2006/0227398 | A1* | 10/2006 | Lawrence et al. ............... 359/15 |
| 2007/0111481 | A1 | 5/2007 | Tamura et al. |
| 2007/0207594 | A1* | 9/2007 | Tamura ......................... 438/463 |
| 2007/0298529 | A1* | 12/2007 | Maeda et al. .................... 438/33 |
| 2008/0217311 | A1 | 9/2008 | Eberhardt et al. |
| 2008/0242056 | A1 | 10/2008 | Sercel et al. |
| 2009/0014425 | A1 | 1/2009 | Zuehlke et al. |
| 2009/0294422 | A1* | 12/2009 | Lubatschowski et al. ....................... 219/121.72 |
| 2010/0025387 | A1 | 2/2010 | Arai et al. |
| 2010/0047587 | A1 | 2/2010 | Itoh et al. |
| 2010/0177794 | A1 | 7/2010 | Peng et al. |
| 2010/0246611 | A1 | 9/2010 | Sun |
| 2010/0252540 | A1 | 10/2010 | Lei et al. |
| 2010/0301027 | A1 | 12/2010 | Sercel et al. |
| 2011/0132885 | A1 | 6/2011 | Sercel et al. |
| 2011/0182306 | A1 | 7/2011 | Hosseini et al. |

FOREIGN PATENT DOCUMENTS

| | | |
|---|---|---|
| WO | 2008035770 | 3/2008 |
| WO | 2008126742 | 10/2008 |
| WO | 2009103313 | 8/2009 |

OTHER PUBLICATIONS

Saliminia., A, "Densification of silica glass induced by 0.8 and 1.5• μm intense femtosecond laser pulses", J. App. Plys. 99, 093104-1 (2006).

Ahmed, F. et al., "Display glass cutting by femtosecond laser induced single shot periodic void array", Appl. Phys. A 93: 189-192, (2008).

Chin, S., "The physics and the challenge of the propagation of powerful femtosecond laser pulses in optical media", La Physique Au Canada, 60(5), 273 (2004).

Yoshino et al. Micromachining with a High Repetition Rate Femtosecond Fiber Laser. Journal of Laser Micro/Nanoengineering. 2008. vol. 3. No. 3.

PCT International Search Report. PCT/CA2011/05427. Mailed Nov. 22, 2011.

* cited by examiner

METHOD OF MATERIAL PROCESSING BY LASER FILAMENTATION

CROSS-REFERENCE TO RELATED APPLICATIONS

This application is a National Phase application claiming the benefit of PCT/CA2011/050427 filed on Jul. 12, 2011 in English, which further claims priority to U.S. Provisional Application No. 61/363,568, titled "Method of Material Processing by Laser Filamentation" and filed on Jul. 12, 2010, the entire contents of which are incorporated herein by reference, and to U.S. Provisional Application No. 61/372,967, titled "Method of Material Processing by Laser Filamentation" and filed on Aug. 12, 2010, the entire contents of which are incorporated herein by reference.

BACKGROUND

The present disclosure is related to methods of laser processing of materials. More particularly, the present disclosure is related to methods of singulation and/or cleaving of wafers, substrates, and plates.

In current manufacturing, the singulation, dicing, scribing, cleaving, cutting, and facet treatment of wafers or glass panels is a critical processing step that typically relies on diamond cutting, with speeds of 30 cm/sec for flat panel display as an example. After diamond cutting, a mechanical roller applies stress to propagate cracks that cleave the sample. This process creates poor quality edges, microcracks, wide kerf width, and substantial debris that are major disadvantages in the lifetime, quality, and reliability of the product, while also incurring additional cleaning and polishing steps. The cost of de-ionized water to run the diamond scribers are more than the cost of ownership of the scriber and the technique is not environmentally friendly since water gets contaminated and needs refining that itself adds the costs. By advance techniques dyes on the wafers are getting smaller and closer to each other that limit the diamond scribing. 30 um is a good scribing width and 15 um is challenging. Since diamond scribing uses mechanical force to scribe the substrate, thin samples are very difficult to scribe. The FPD industry is seeking to reduce glass thicknesses to 150-300 um from conventional 400-700 um that is used currently and scribing the plates is the major issue. Indeed the FPD industry is looking to use thin tempered glass instead of ordinary glass for durability.

Laser ablative machining is an active development area for singulation, dicing, scribing, cleaving, cutting, and facet treatment, but has disadvantages, particularly in transparent materials, such as slow processing speed, generation of cracks, contamination by ablation debris, and moderated sized kerf width. Further, thermal transport during the laser interaction can lead to large regions of collateral thermal damage (i.e. heat affected zone). Laser ablation processes can be dramatically improved by selecting lasers with wavelengths that are strongly absorbed by the medium (for example, deep UV excimer lasers or far-infrared CO2 laser). However, the above disadvantages cannot be eliminated due to the aggressive interactions inherent in this physical ablation process.

Alternatively, laser ablation can also be improved at the surface of transparent media by reducing the duration of the laser pulse. This is especially advantageous for lasers that are transparent inside the processing medium. When focused onto or inside transparent materials, the high laser intensity induces nonlinear absorption effects to provide a dynamic opacity that can be controlled to accurately deposit appropriate laser energy into a small volume of the material as defined by the focal volume. The short duration of the pulse offers several further advantages over longer duration laser pulses such as eliminating plasma reflections and reducing collateral damage through the small component of thermal diffusion and other heat transport effects during the much shorter time scale of such laser pulses. Femtosecond and picosecond laser ablation therefore offer significant benefits in machining of both opaque and transparent materials. However, machining of transparent materials with pulses even as short as tens to hundreds of femtosecond is also associated with the formation of rough surfaces and microcracks in the vicinity of laser-formed hole or trench that is especially problematic for brittle materials like glasses and optical crystals. Further, ablation debris will contaminate the nearby sample and surrounding surfaces.

A kerf-free method of cutting or scribing glass and related materials relies on a combination of laser heating and cooling, for example, with a CO2 laser and a water jet. [U.S. Pat. No. 5,609,284 (Kondratenko); U.S. Pat. No. 6,787,732 UV laser (Xuan)] Under appropriate conditions of heating and cooling in close proximity, high tensile stresses are generated that induces cracks deep into the material, that can be propagated in flexible curvilinear paths by simply scanning the laser-cooling sources across the surface. In this way, thermal-stress induced scribing provides a clean splitting of the material without the disadvantages of a mechanical scribe or diamond saw, and with no component of laser ablation to generate debris. However, the method relies on stress-induced crack formation to direct the scribe and requires [WO/2001/032571 LASER DRIVEN GLASS CUT-INITIATION] a mechanical or laser means to initiate the crack formation. Short duration laser pulses generally offer the benefit of being able to propagate efficiently inside transparent materials, and locally induce modification inside the bulk by nonlinear absorption processes at the focal position of a lens. However, the propagation of ultrafast laser pulses ($>$~5 MW peak power) in transparent optical media is complicated by the strong reshaping of the spatial and temporal profile of the laser pulse through a combined action of linear and nonlinear effects such as group-velocity dispersion (GVD), linear diffraction, self-phase modulation (SPM), self-focusing, multiphoton/tunnel ionization (MPI/TI) of electrons from the valence band to the conduction band, plasma defocusing, and self-steepening [S L Chin et al. Canadian Journal of Physics, 83, 863-905 (2005)]. These effects play out to varying degrees that depend on the laser parameters, material nonlinear properties, and the focusing condition into the material.

Kamata et al. [SPIE Proceedings 6881-46, High-speed scribing of flat-panel display glasses by use of a 100-kHz, 10-W femtosecond laser, M. Kamata, T. Imahoko, N. Inoue, T. Sumiyoshi, H. Sekita, Cyber Laser Inc. (Japan); M. Obara, Keio Univ. (Japan)] describe a high speed scribing technique for flat panel display (FPD) glasses. A 100-kHz Ti:sapphire chirped-pulse-amplified laser of frequency-doubled 780 nm, 300 fs, 100 µJ output was focused into the vicinity of the rear surface of a glass substrate to exceed the glass damage threshold, and generate voids by optical breakdown of the material. The voids reach the back surface due to the high repetition rate of the laser. The connected voids produce internal stresses and damage as well as surface ablation that facilitate dicing by mechanical stress or thermal shock in a direction along the laser scribe line. While this method potentially offers fast scribe speeds of 300 mm/s, there exists a finite kerf width, surface damage, facet roughness, and ablation debris as the internally formed voids reach the surface.

SUMMARY

In a first embodiment, there is provided a method of preparing a substrate for cleavage, the method comprising the steps of: irradiating the substrate with one or more pulses of a focused laser beam, wherein the substrate is transparent to the laser beam, and wherein the one or more of pulses have an energy and pulse duration selected to produce a filament within the substrate; translating the substrate relative to the focused laser beam to irradiate the substrate and produce an additional filament at one or more additional locations; wherein the filaments comprise an array defining an internally scribed path for cleaving the substrate. The method preferably includes the step of cleaving the substrate.

The substrate is preferably translated relative to the focused laser beam with a rate selected to produce a filament spacing on a micron scale. Properties of the one or more laser pulses are preferably selected to provide a sufficient beam intensity within the substrate to cause self-focusing of the laser beam.

The one or more pulses may be provided two or more times with a prescribed frequency, and the substrate may be translated relative to the focused laser beam with a substantially constant rate, thus providing a constant spacing of filaments in the array.

The one or more pulses include a single pulse or a train of two or more pulses. Preferably, a time delay between successive pulses in the pulse train is less than a time duration over which relaxation of one or more material modification dynamics occurs. A pulse duration of each of the one or more pulses is preferably less than about 100 ps, and more preferably less than about 10 ps.

A location of a beam focus of the focused laser beam may be selected to generate the filaments within the substrate, wherein at least one surface of the substrate is substantially free from ablation. A location of a beam focus of the focused laser beam may be selected to generate a V groove within at least one surface of the substrate.

The substrate may be a glass or a semiconductor and may be selected from the group consisting of transparent ceramics, polymers, transparent conductors, wide bandgap glasses, crystals, crystal quartz, diamond, and sapphire.

The substrate may comprise two or more layers, and wherein a location of a beam focus of the focused laser beam is selected to generate filaments within at least one of the two or more layers. The multilayer substrate may comprise multilayer flat panel display glass, such as a liquid crystal display (LCD), flat panel display (FPD), and organic light emitting display (OLED). The substrate may also be selected from the group consisting of autoglass, tubing, windows, biochips, optical sensors, planar lightwave circuits, optical fibers, drinking glass ware, art glass, silicon, III-V semiconductors, microelectronic chips, memory chips, sensor chips, light emitting diodes (LED), laser diodes (LD), and vertical cavity surface emitting laser (VCSEL).

A location of a beam focus of the focused laser beam may be selected to generate filaments within two or more of the two or more layers, wherein the focused laser beam generates a filament in one layer, propagates into at least one additional layer, and generates a filament is the at least one additional layer.

Alternatively, the location of a beam focus of the focused laser beam may be first selected to generate filaments within a first layer of the two or more layers, and the method may further comprise the steps of: positioning a second beam focus within a second layer of the two or more layers; irradiating the second layer and translating the substrate to produce a second array defining a second internally scribed path for cleaving the substrate. The substrate may be irradiated from an opposite side relative to when irradiating the first layer. Furthermore, prior to irradiating the second layer, a position of the second beam focus may be laterally translated relative a position of the beam focus when irradiating the first layer. A second focused laser beam may be used to irradiate the second layer.

A further understanding of the functional and advantageous aspects of the disclosure can be realized by reference to the following detailed description and drawings.

BRIEF DESCRIPTION OF THE DRAWINGS

Embodiments of the disclosure will now be described, by way of example only, with reference to the drawings, in which.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms, "comprises" and "comprising" are to be construed as being inclusive and open ended, and not exclusive. Specifically, when used in the specification and claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately", when used in conjunction with ranges of dimensions of particles, compositions of mixtures or other physical properties or characteristics, are meant to cover slight variations that may exist in the upper and lower limits of the ranges of dimensions so as to not exclude embodiments where on average most of the dimensions are satisfied but where statistically dimensions may exist outside this region. It is not the intention to exclude embodiments such as these from the present disclosure.

As used herein, the term "transparent" means a material that is at least partially transparent to an incident optical beam. More preferably, a transparent substrate is characterized by absorption depth that is sufficiently large to support the generation of an internal filament by an incident beam according to embodiments described below.

Figure 1A:
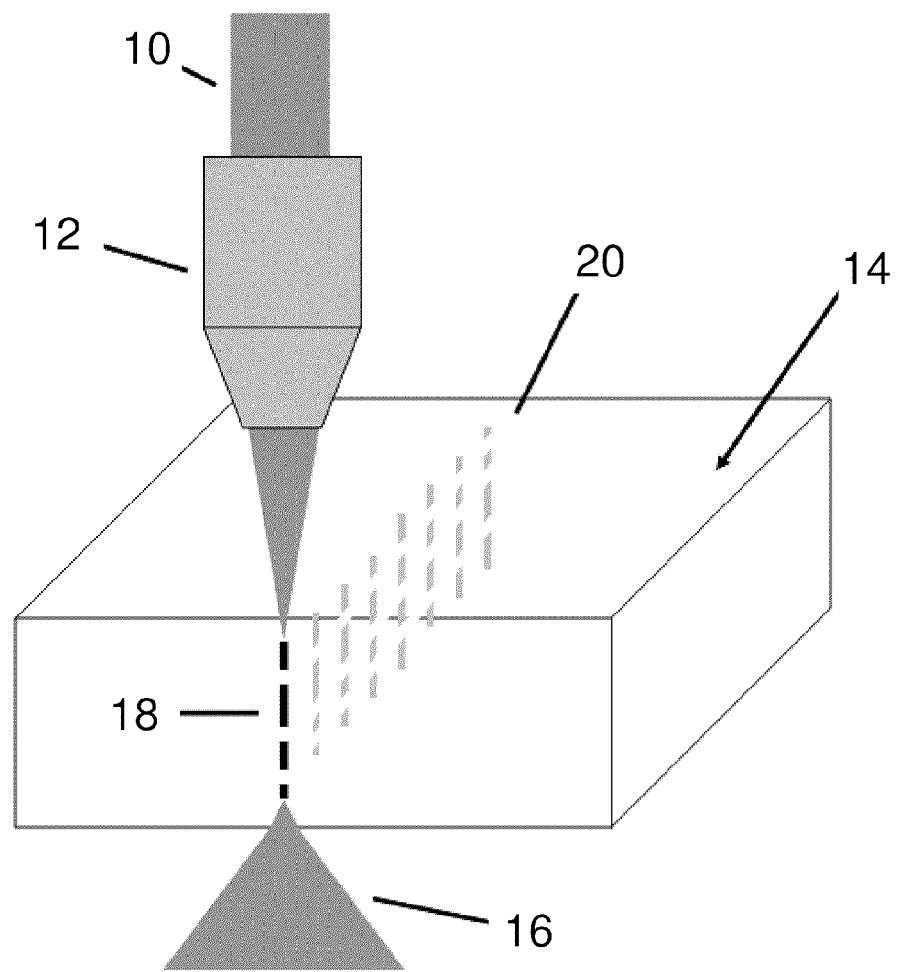
FIG. 1 presents (a) front and (b) side views of the laser filamentation scribing arrangement for scribing transparent materials.
Figure 1B:
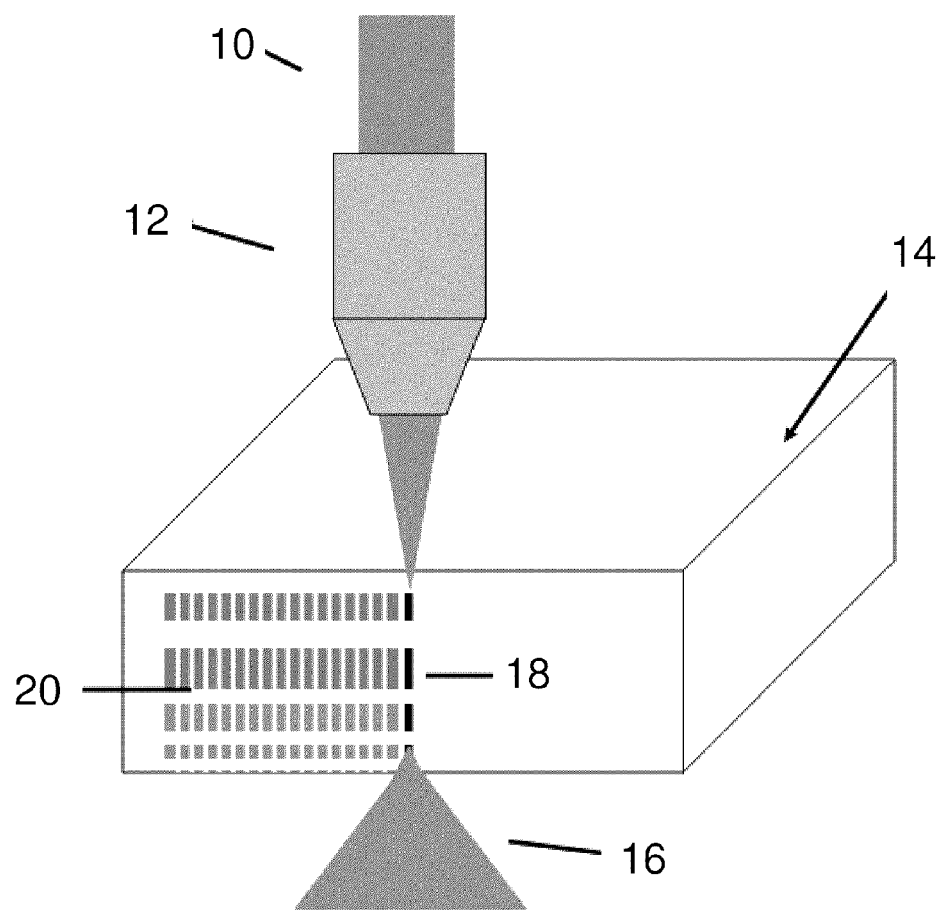

FIG. 1 presents a schematic arrangement shown in (a) front and (b) side views for forming laser filaments in a transparent substrate. Short duration laser pulses 10 are focused with objective lens 12 inside transparent substrate 14. At appropriate laser pulse energy, the laser pulse, or sequence of pulses, or burst-train of pulses, a laser filament 18 is generated within the substrate, producing internal microstructural modification with a shape defined by the laser filament volume. By moving the sample relative to the laser beam during pulsed laser exposure, a continuous trace of filament tracks 20 are permanently inscribed into the glass volume as defined by the curvilinear or straight path followed by the laser in the sample.

Without intending to be limited by theory, it is believed that the filaments are produced by weak focusing, high intensity short duration laser light, which can self-focus by the nonlinear Kerr effect, thus forming a so-called filament. This high spatio-temporal localization of the light field can deposit laser energy in a long narrow channel, while also being associated with other complex nonlinear propagation effects such as white light generation and formation of dynamic ring radiation structures surrounding this localized radiation.

On the simplest level, the filamentation process is believed to depend mainly on two competing processes. First, the spatial intensity profile of the laser pulse acts like a focusing lens due to the nonlinear optical Kerr effect. This causes the beam to self-focus, resulting in an increase of the peak intensity. This effect is limited and balanced by increasing diffraction as the diameter decreases until a stable beam waist diameter is reached that can propagate distances many times longer than that expected from a simple calculation of the confocal beam parameter (or depth of focus) from this spot size.

At high peak intensity, multiphoton ionization, field ionization, and electron impact ionization of the medium sets in to create low-density plasma in the high intensity portion of the laser beam. This plasma temporarily lowers the refractive index in the centre of the beam path causing the beam to defocus and break up the filament. The dynamic balance between Kerr effect self-focusing and plasma defocusing can lead to multiple re-focused laser interaction filaments through to formation of a stable filament, sometimes called a plasma channel. As show in the examples below, using picosecond pulses, the present inventors have found that when the pulse focuses, it stays confined for about 500 to 1000 µm (depending on the focusing lens which is used), and then spatially diverges when there is no more material for refocusing and forming the next filament, or when the pulses do not have enough energy to refocus to form another plasma channel.

Optical breakdown, on the other hand, is the result of a tightly focused laser beam inside a transparent medium that forms a localized dense plasma around the geometrical focus. The plasma generation mechanism is based on initial multiphoton excitation of electrons, followed by inverse Bremsstrahlung, impact ionization, and electron avalanche processes. Such processes underscore the refractive index and void formation processes described above [U.S. Pat. No. 6,154,593; SPIE Proceedings 6881-46,], and form the basis of most short-pulse laser applications for material processing. In this optical breakdown domain, the singulation, dicing, scribing, cleaving, cutting, and facet treatment of transparent materials has disadvantages such as slow processing speed, generation of cracks, contamination by ablation debris, and large kerf width.

In contrast, laser filamentation offers a new direction for internal laser processing of transparent materials that can avoid ablation or surface damage, dramatically reduce kerf width, avoid crack generation, and speed processing times for such scribing applications. Further, high repetition rate lasers defines a new direction to enhance the formation of laser beam filaments with heat accumulation and other transient responses of the material on time scales faster than thermal diffusion out of the focal volume (typically <10 microseconds).

Accordingly, embodiments disclosed herein harnesses short duration laser pulses (preferably with a pulse duration less than about 100 ps) to generate a filament inside a transparent medium. The method avoids dense plasma generation such as through optical break down that can be easily produced in tight optical focusing conditions as typically applied and used in femtosecond laser machining. In weak focusing, which is preferential, the nonlinear Kerr effect is believed to create an extended laser interaction focal volume that greatly exceeds the conventional depth of focus, overcoming the optical diffraction that normally diverges the beam from the small self-focused beam waist.

Once a filamentation array is formed in the transparent substrate, only small mechanical pressure is required to cleave the substrate into two parts on a surface shape that is precisely defined by the internal laser-filamentation curtain. The laser-scribed facets typically show no or little cracking and microvoids or channels are not evident along the scribed zone. There is substantially no debris generated on the top or bottom surfaces since laser ablation at the surfaces can be avoided by confining the laser filament solely within the bulk glass. On the other hand, simple changes to the laser exposure or sample focusing conditions can move the filament to the surface and thus induce laser ablation machining if desired, as described further below. This assists in creating very sharp V groves on the surface of the substrate. To scribe very thin substrates (less than 400 um thick) creating a sharp V groove is desired. Other common ablation techniques generally create U grooves or rounded V grooves. V grooves also can form on both top and bottom surface of the sample making scribed edges chamfered.

Laser energy deposited along such filaments leads to internal material modification that can be in the form of defects, color centers, stress, microchannels, microvoids, and/or microcracks. The present method entails lateral translation of the focused laser beam to form an array of closely positioned filament-induced modification tracks. This filament array defines a pseudo-continuous curtain of modification inside the transparent medium without generating laser ablation damage at either of the top or bottom surfaces. This curtain renders the glass plate highly susceptible to cleaving when only very slight pressure (force) is applied, or may spontaneously cleave under internal stress. The cleaved facets are devoid of ablation debris, show minimal or no microcracks and microvents, and accurately follow the flexible curvilinear or straight path marked internally by the laser with only very small kerf width as defined by the self-focused beam waist.

The application of high repetition rate bursts of short-pulse lasers offers the advantage of heat accumulation and other transient effects such that thermal transport and other related mechanisms are not fully relaxed prior to the arrival of subsequent laser pulses [U.S. Pat. No. 6,552,301 B2 Burst-UF laser Machining]. In this way, heat accumulation, for example, can present a thin heated sheath of ductile glass to subsequent laser pulses that prevents the seeding of microcracks while also retaining the advantages (i.e. nonlinear absorption, reduced collateral damage) of short pulse ablative machining in an otherwise brittle material. In all the above laser ablation methods, the cutting, scribing, or dicing of transparent materials will generate ablation debris contamination and consume a kerf width to accommodate the removed material, while also generating collateral laser damage. Therefore, a non-ablative method of laser processing would be desirable.

The application of high repetition rate short-pulse lasers thus offers a means for dramatically increasing the processing (scan) speed for such filamentation cleaving. However, at sufficiently high repetition rate (transition around 100 MHz to 1 MHz), the modification dynamics of the filament is dramatically enhanced through a combination of transient effects involving one or more of heat accumulation, plasma dynamics, temporary and permanent defects, color centers, stresses, and material defects that accumulate and do not relax fully during the train of pulses to modify the sequential pulse-to-pulse interactions. Laser filaments formed by such burst trains offer significant advantage in lowering the energy threshold for filament formation, increasing the filament length to hundreds of microns or several millimeters, thermally annealing of the filament modification zone to minimize collateral damage, improving process reproducibility, and increasing the processing speed compared with the use of low repetition rate lasers. In one non-limiting manifestation at such high repetition rate, there is insufficient time (i.e. 10 nsec to 1 μs) between laser pulses for thermal diffusion to remove the absorbed laser energy, and heat thereby accumulates locally with each laser pulse. In this way, the temperature in the interaction volume rises during subsequent laser pulses, leading to laser interactions with more efficient heating and less thermal cycling. In this domain, brittle materials become more ductile to mitigate crack formation. Other transient effects include temporary defects and plasma that survive from previous laser pulse interactions. These transient effects then serve to extend the filamentation process to long interaction lengths, and/or improve absorption of laser energy in subsequent pulses.

As shown below, the laser filamentation method can be tuned by various methods to generate multi-filament tracks broken with non-filamenting zones through repeated cycles of Kerr-lens focusing and plasma defocusing. Such multi-level tracks can be formed in a thick transparent sample, across several layers of glasses separated by transparent gas or other transparent materials, or in multiple layers of different transparent materials. By controlling the laser exposure to only form filaments in the solid transparent layers, one can avoid ablation and debris generation on each of the surfaces in the single or multi-layer plates. This offers significant advantages in manufacturing, for example, where thick glasses or delicate multilayer transparent plates must be cleaved with smooth and crack free facets.

The filamentation method applies to a wide range of materials that are transparent to the incident laser beam, including glasses, crystals, selected ceramics, polymers, liquid-encapsulated devices, multi-layer materials or devices, and assemblies of composite materials. In the present disclosure, it is further to be understood that the spectral range of the incident laser beam is not limited to the visible spectrum, but represents any material that is transparent to a laser wavelength also in the vacuum ultraviolet, ultraviolet, visible, near-infrared, or infrared spectra. For example, silicon is transparent to 1500 nm light but opaque to visible light. Thus, laser filaments may be formed in silicon with short pulse laser light generated at this 1500 nm wavelength either directly (i.e. Erbium-doped glass lasers) or by nonlinear mixing (i.e. optical parametric amplification) in crystals or other nonlinear medium.

In substrates that are transparent within the visible spectrum, the laser filament may result in the generation of white light, which without being limited by theory, is believed to be generated by self phase modulation in the substrate and observed to emerge for the laser filamentation zone in a wide cone angle 16 after the filament ends due to factors such reduced laser pulse energy or plasma defocusing.

The length and position of the filament is readily controlled by the lens focusing position, the numerical aperture of objective lens, the laser pulse energy, wavelength, duration and repetition rate, the number of laser pulses applied to form each filament track, and the optical and thermo-physical properties of the transparent medium. Collectively, these exposure conditions can be manipulated to create sufficiently long and strong filaments to nearly extend over the full thickness of the sample and end without breaking into the top or bottom surfaces. In this way, surface ablation and debris can be avoided at both surfaces and only the interior of the transparent substrate is thus modified. With appropriate beam focusing, the laser filament can terminate and cause the laser beam to exit the glass bottom surface at high divergence angle 16 such that laser machining or damage is avoided at the bottom surface of the transparent plate.

Figure 2A:
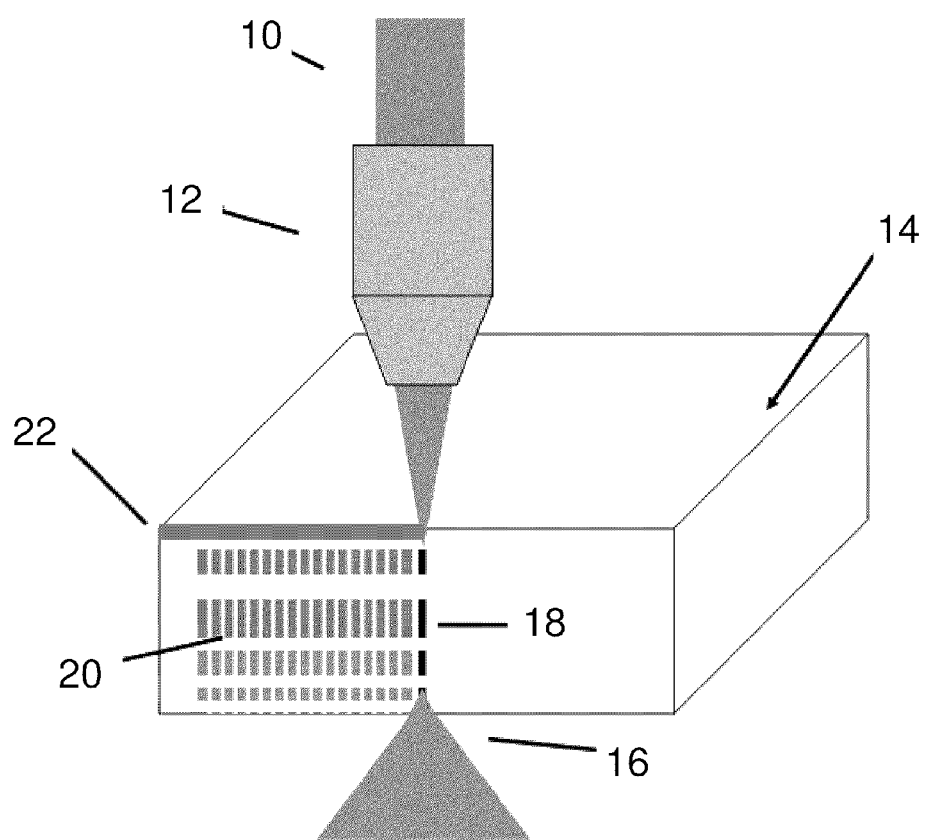
FIG. 2 presents a front view of (a) laser filamentation with V groove scribing of transparent substrate and (b) V groove scribing with suppressed filament formation.
Figure 2B:
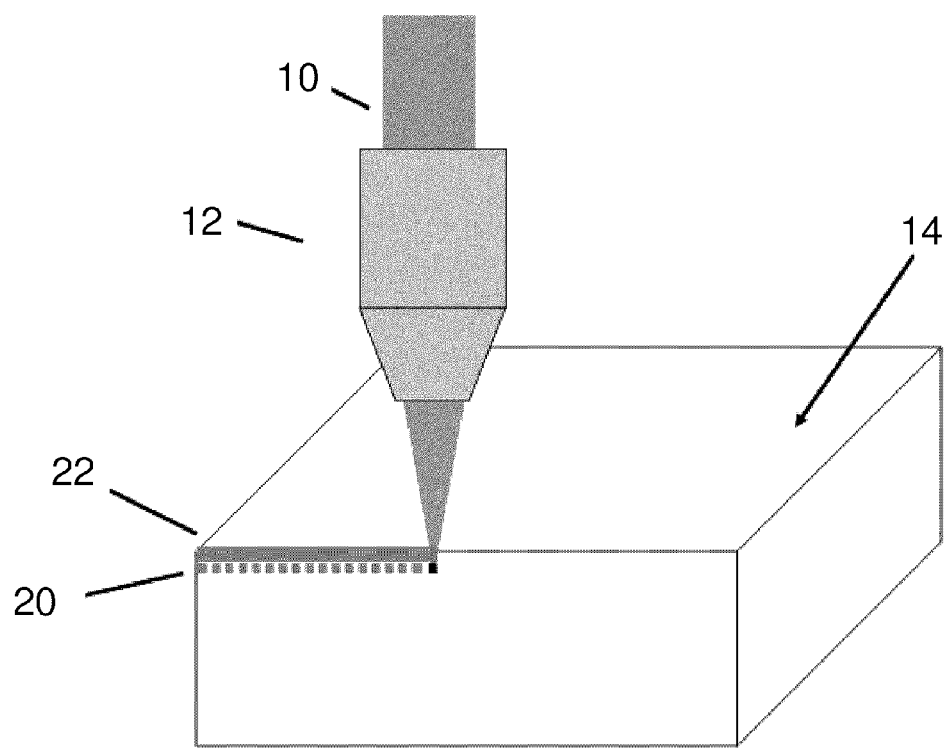

FIG. 2 presents a schematic arrangement shown in a side view for (a) forming laser filaments 20 with surface V groove formation 22(b) V groove formation with suppressed filament formation. For higher quality scribing with edge chamfered property, laser processing can be arranged such that filaments forms inside the transparent material and very sharp V groove that is the result of ablation from on top of the surface. For some applications where clean facet is required or higher scribing speed is considered, filaments can be suppressed or completely removed.

In one embodiment, the method is employed for the scribing and cleaving of optical display glass substrates such as flat panel displays. A flat panel display is the sandwich of two glasses substrates. The bottom glass substrate may be printed with circuits, pixels, connectors, and/or transistors, among other electrical elements. A gap between the substrates is filled with liquid crystal materials. The top and left edge of the LCD can be scribed without any offset but the right and bottom edge typically has an offset of about 5 mm which is call the pad area, and all electronics connected through this region to the LCD elements.

This area is the source of a major bottleneck that limits using high power lasers for flat panel display laser scribing, because during top layer scribing, all the circuitry on the bottom layer may be damaged. To simulate a flat panel device, the inventors placed a top glass substrate on the surface of a coated mirror. During laser filament scribing of the top glass of a double glass plate, it is preferably to adjust the location of filaments formed within the top glass plate so as to avoid damage on the bottom layer that generally contains a metal coating (as described above). The results from this experiment highlighted two important points. Firstly, laser scribing can be achieved without damaging the coating of the bottom substrate pad area, and secondly, when filaments located in a special position closer to the bottom surface, reflection from the bottom metal surface may machine or process the bottom surface of the top layer, creating a V groove on the bottom.

Figure 3:
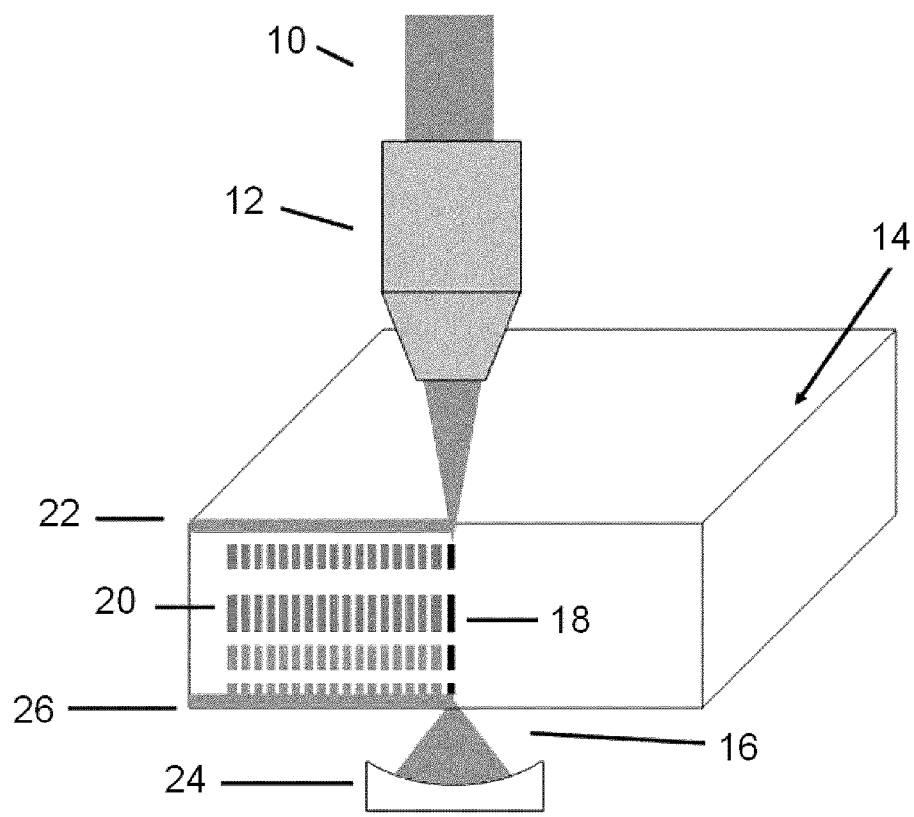
FIG. 3 illustrates laser scribing of transparent material with internal filament formation with V groove formation on the top and bottom surface applying reflective element with focusing arrangement.

Further investigation results in the method illustrated in FIG. 3, where the diffracted beam 16 is converged back by means of proper concave mirror 24 or combination of mirror and lens to machine the bottom surface of the target to produce second V groove 26. The apparatus has the benefit of making V groove in the bottom edge without using second laser machining from bottom side.

Figure 4:
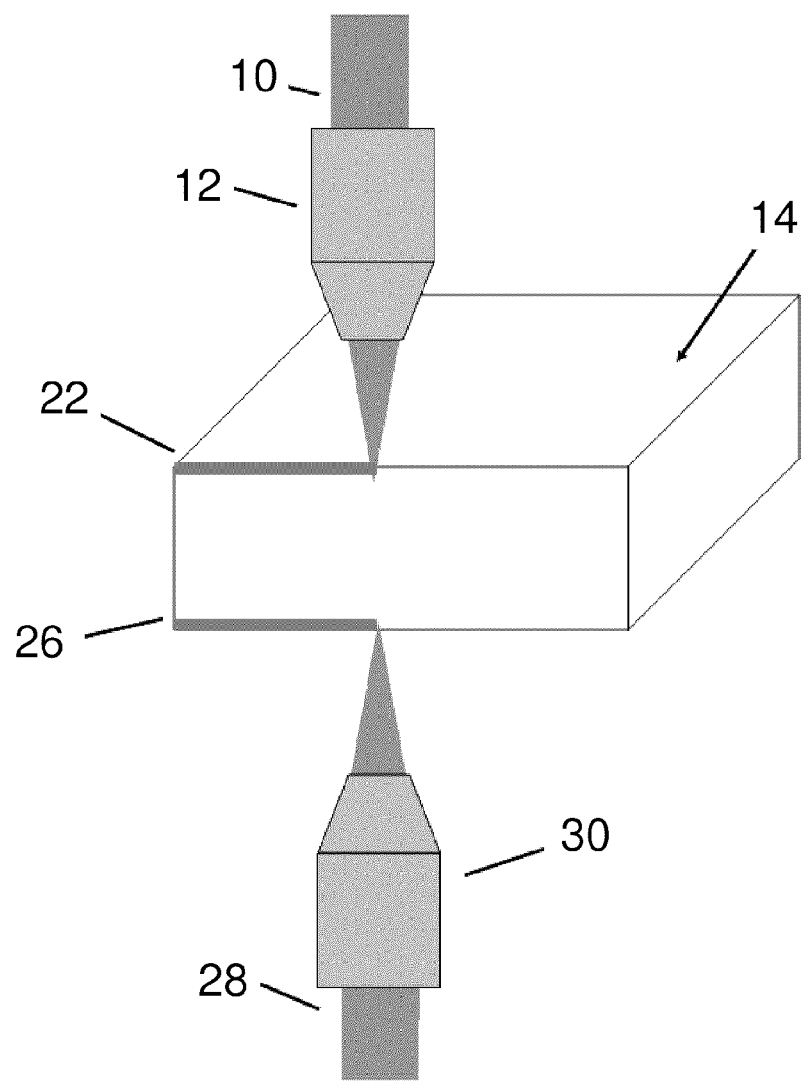
FIG. 4 shows laser scribing using two focusing apparatus applied from top and bottom surface.
Figure 5:
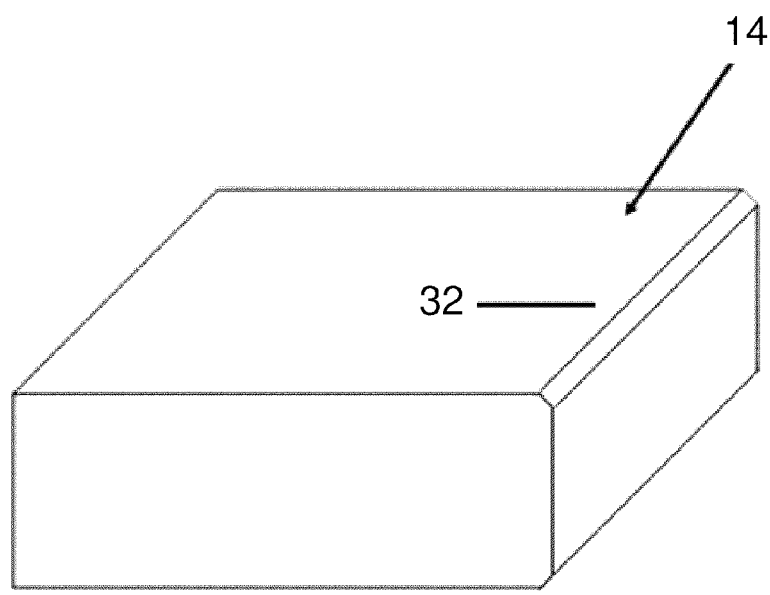
FIG. 5 presents a side view of a scribed substrate, where the top, bottom or both edges can be chamfered.

For some applications where a clean or shiny facet is required, the arrangement of FIG. 4 may be employed to create sharp V grooves on the top and bottom layer of the glass. In this mode of operation both edges are chamfered through laser scribing via the addition of a second beam 28 and objective 30, and no need for further chamfering or grinding that would otherwise necessitate washing and drying. The side and front view of the cleaved sample is shown in FIG. 5, where the surface of V groove 32 is shown after cleaving.

Figure 6:
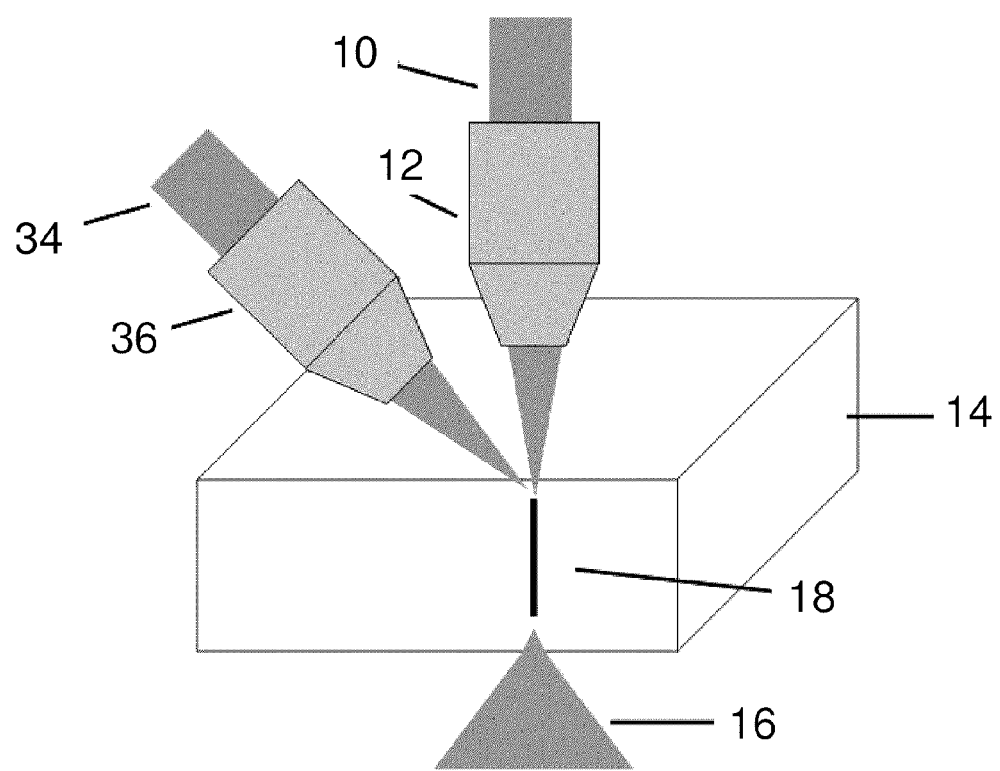
FIG. 6 presents a focusing arrangement of delivering multiple converging laser beams for creating multiple filaments simultaneously in a transparent substrate at different physical positions, directions, angles, and depths, such that the filaments are overlapping to enable the single-step cleaving of beveled facets or other facet shapes.

FIG. 6 presents an example of a focusing arrangement for delivering multiple converging laser beams into a transparent plate for creating multiple filaments simultaneously. The beams 10 and 34 may be separated from a single laser source using well know beam splitter devices and focused with separate lenses 12 and 36 as shown. Alternatively, diffractive optics, multi-lens systems and hybrid beam splitting and focusing systems may be employed in arrangements well known to an optical practitioner to create the multiple converging beams that enter the plate at different physical positions, directions, angles, and depths. In this way, filamentation modification tracks 18 are created in parallel in straight or curvilinear paths such that multiple parts of the plate can be laser written at the same time and subsequently scribed along the multiple modification tracks for higher overall processing speed.

Figure 7A:
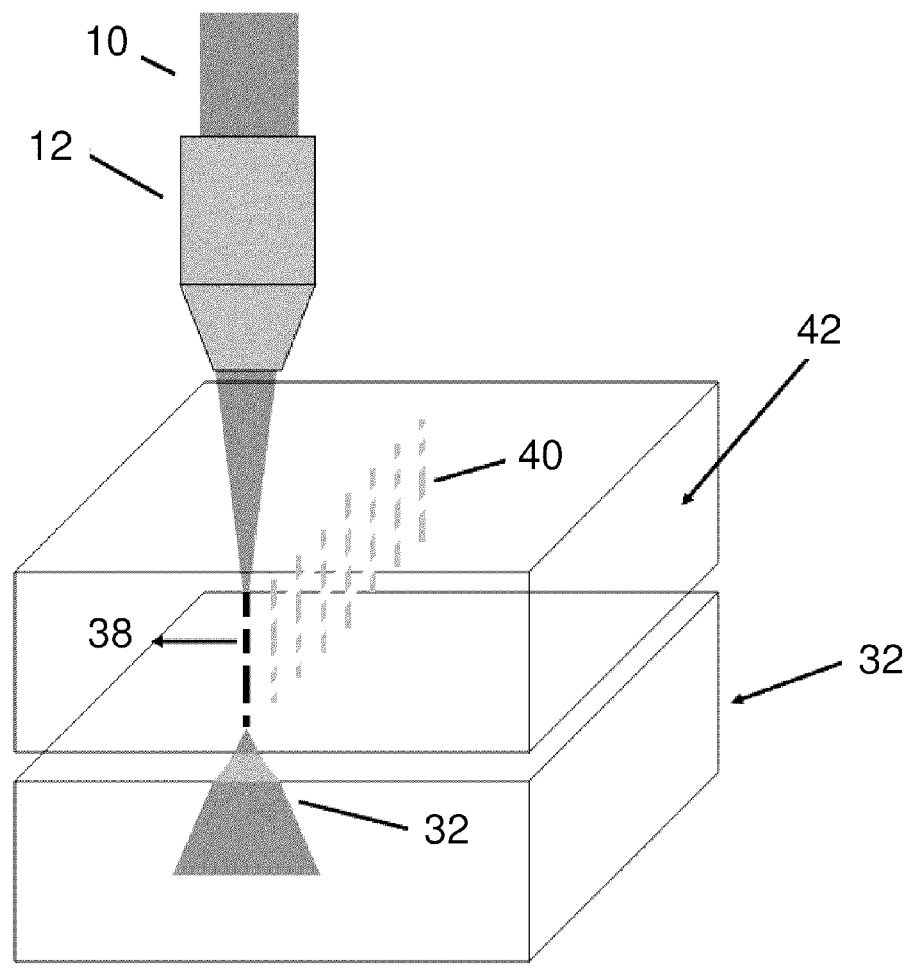
FIG. 7 presents three different focusing arrangements for laser filamentation scribing (a) a top transparent substrate without damaging top surface of a bottom substrate, (b) the bottom substrate from a top location, and (c) a double plate assembly which can be scribed separated, or laser scribed simultaneously, forming filaments in both substrates without optical breakdown in the medium between the plates so that the double plate assembly can be separated along similar curvilinear or straight lines.
Figure 7B:
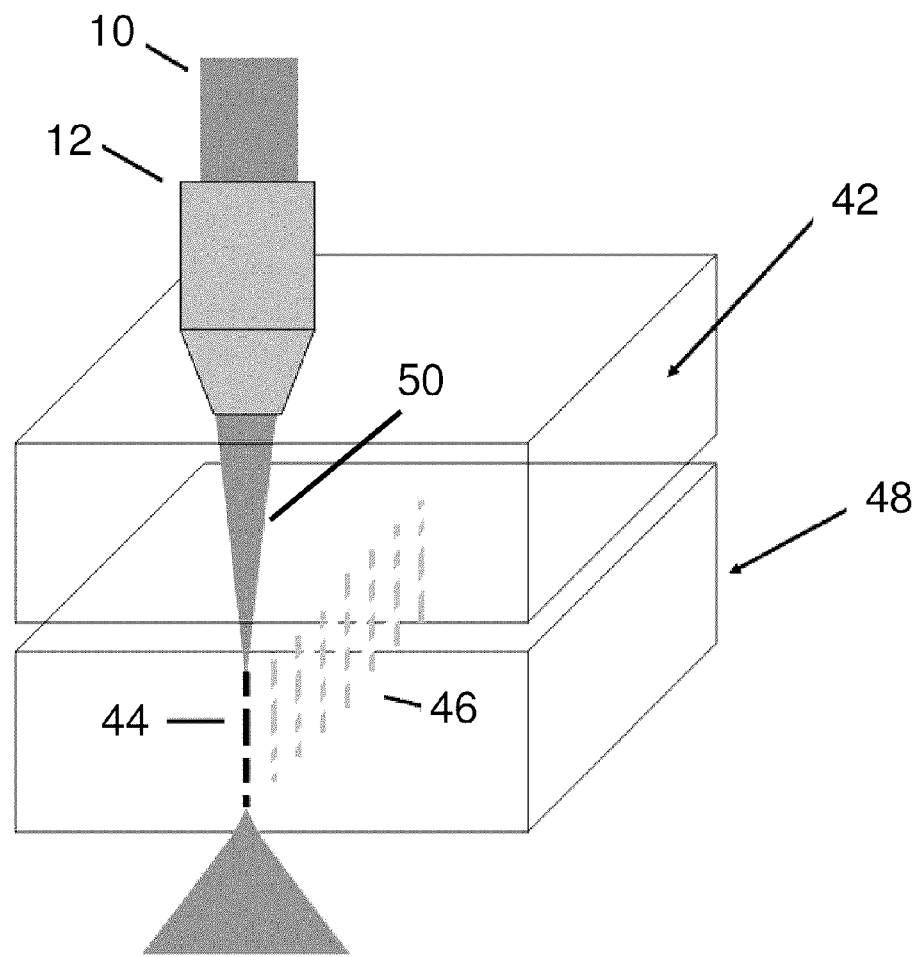

FIG. 7 presents a schematic arrangement for two different focusing conditions for laser filamentation writing that confines the array 38 of modification tracks 40 solely in a top transparent substrate 42 (FIG. 7(a)) as a first laser exposure step, and followed sequentially by filamentation writing that solely confines the array 44 of modification tracks 46 inside a lower transparent plate 48 (FIG. 7(b)) in a second laser pass. The laser exposure is tuned to avoid ablation or other laser damage and generation of ablation debris on any of the four surfaces during each laser pass. During scribing of the top plate, no damage occurs in the bottom layer, and visa versa.

One advantage of this one-sided processing is that the assembly of transparent plates does not need to be flipped over to access the second plate 48 due to the transparency of the first plate to the converging laser beam 50. For example, by position the 12 lens closer to the top glass plate 42 in the second pass (FIG. 7b), the filamentation is not initiated in the first plate and near full laser energy enters the second plate where filamentation is then initiated. A second advantage of this approach is that the two plates can be separated along similar lines during the same scribing step which is attractive particularly for assembled transparent plates in flat panel display. This method is extensible to multiple transparent plates.

Figure 7C:
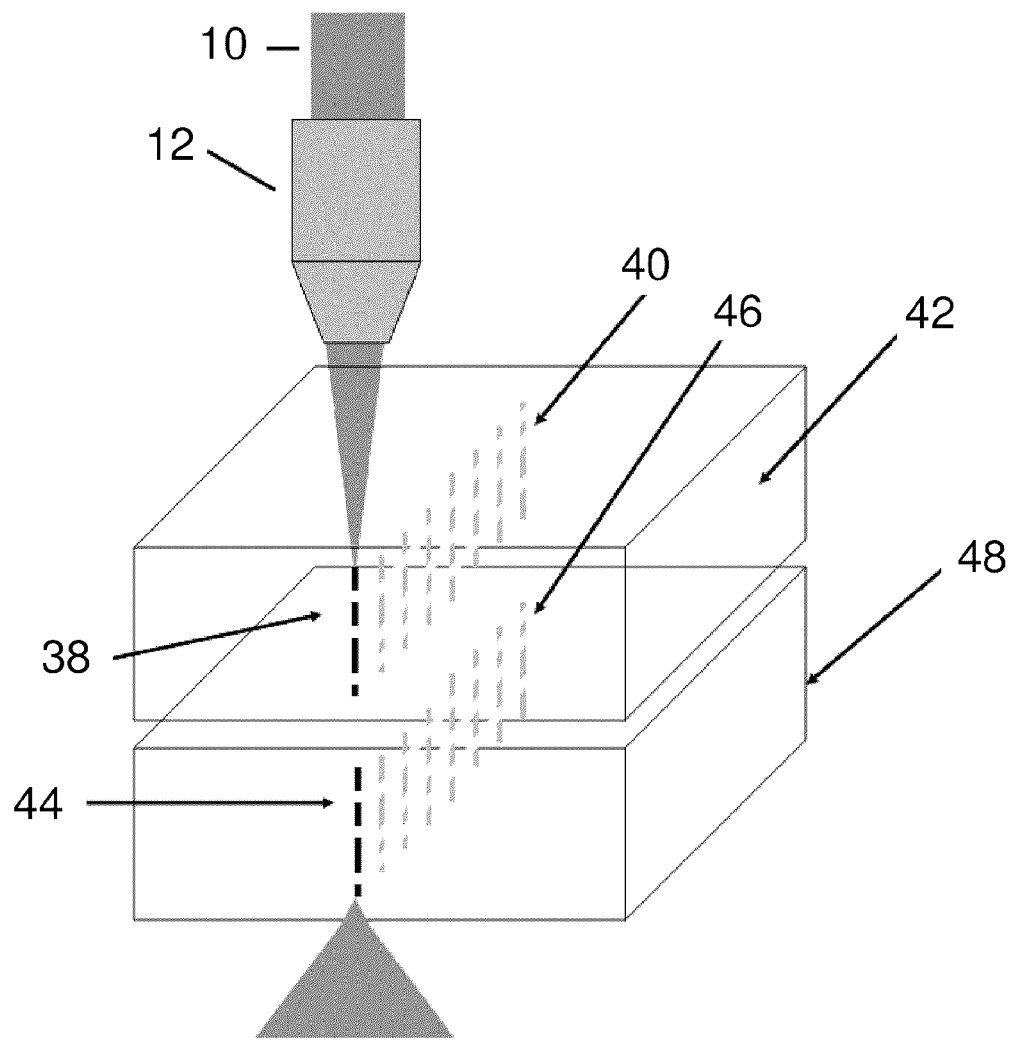

FIG. 7(c) shows an arrangement for inducing laser filamentation simultaneously in two or more transparent plates 42 and 48. This method enables a single pass exposure of both transparent plates to form near-identical shapes or paths of the filamentation modification tracks 38 and 44. In this case, laser parameters are adjusted to create a first filament 38 or array of filament tracks 40 within the top plate 42, such that the filamentation terminates prior to reaching the bottom surface of the top plate, for example, by plasma de-focusing. The diverging laser beam is sufficiently expanded after forming the first filament track to prevent ablation, optical breakdown, or other damage to bottom surface of the top plate, the medium between the two plates, and the top surface of the bottom plate 48.

However, during propagation in this region, self focusing persists and results in the creation of a second filament 44 that is confined solely in the bottom layer transparent plate 48. As such, a single laser beam simultaneously forms two or more separated filaments 38 and 44 that create parallel modification tracks 40 and 46 in two or more stacked plates at the same time. In this way, an assembly of two or more transparent plates can by scribed or separated along the near-parallel filamentation tracks and through all transparent plates in one cleaving step. The medium between the transparent plates must have good transparency and may consist of air, gas vacuum, liquid, solid or combination thereof. Alternatively, the transparent plates may be in physical or near-physical contact without any spacing. This method is extensible to filament processing in multiply stacked transparent plates.

Figure 8:
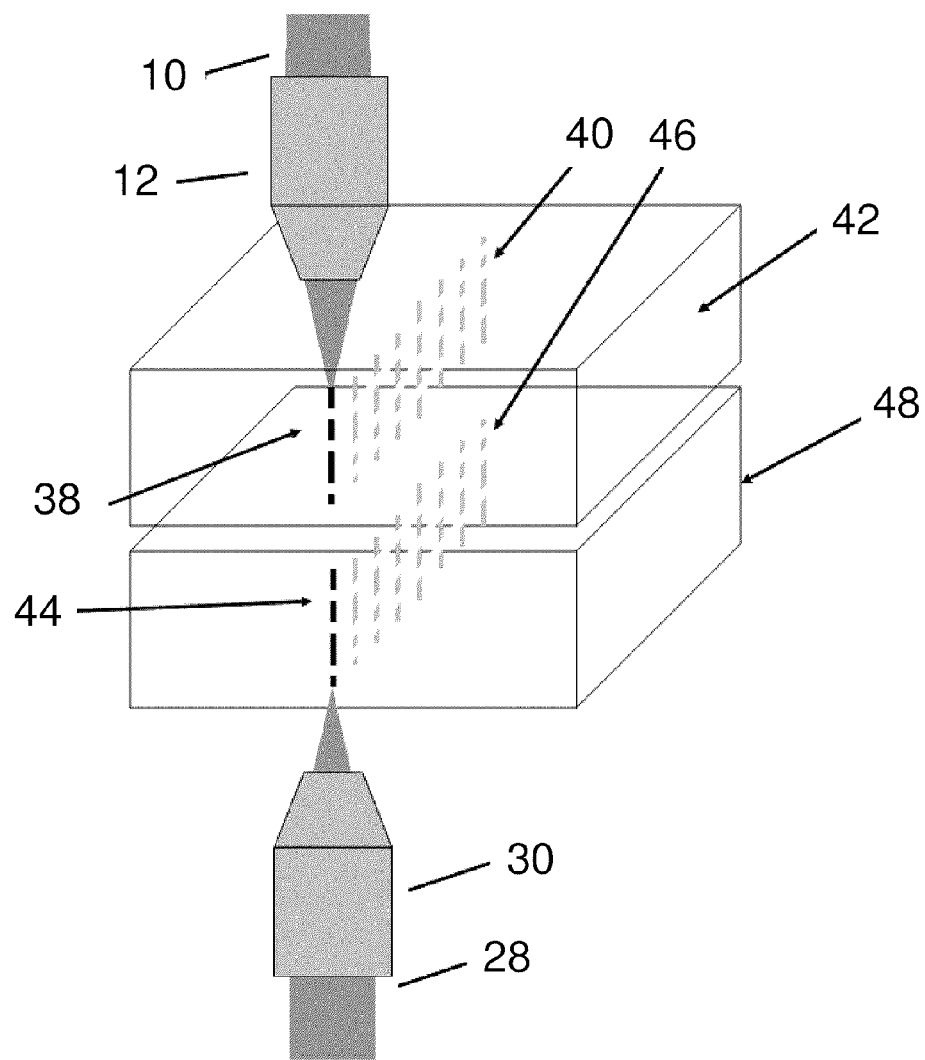
FIG. 8 illustrates laser scribing of a double layer apparatus including two transparent substrates using two focusing beams. Each focus can be adjusted to form a filament, V groove or a combination thereof.

FIG. 8 provides another embodiment of the multibeam filamentation scribing method (shown initially in FIG. 4) for processing double or multiple stacked or layer transparent plates and assemblies. Two converging laser beams are presented to the plate assembly 42 and 48 for creating independent and isolated filaments 38 and 44 in physically separated or contacted transparent plates. Laser exposure conditions are adjusted for each laser beam 10 and 28 (i.e. by vertical displacement of lenses 12 and 30) to localize the filament in each plate. The filament tracks are then formed in similar or off-set positions with similar or different angles and depths. The filamentation tracks may be cleaved simultaneously such that the stack or assembly of optical plates is separated as one unit in a batch process. The upper and lower beams may be provided from a common optical source using conventional beam splitter or may original from two different laser sources. The upper and lower beams may be aligned along a common axis, or spatially offset. Preferably, the relative spatial positioning of the two beams is configurable.

Figure 9A:
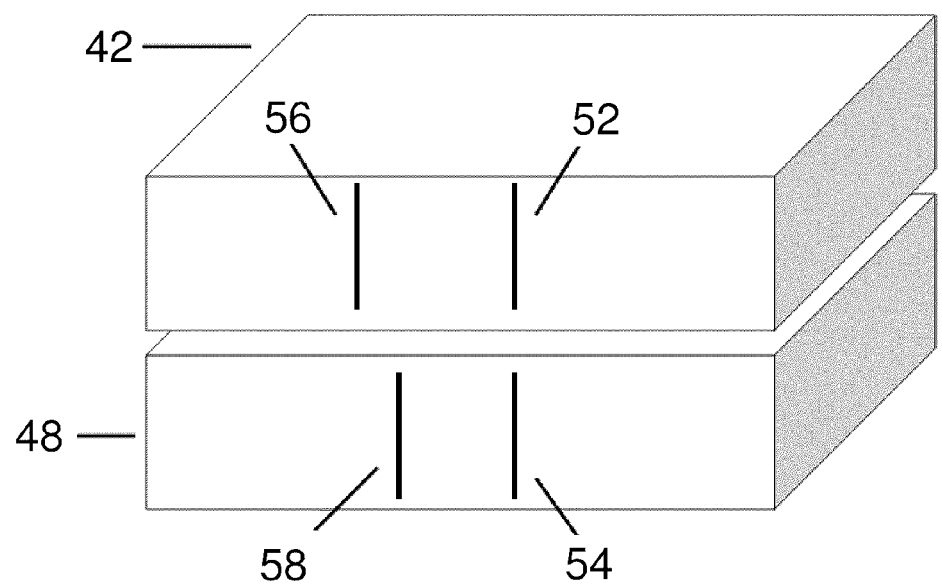
FIG. 9 provides top and side views of a double layer glass after scribing where (a) only internal filaments are formed, (b) internal filaments and top surface V grooves are formed, and (c) only a V groove is formed on the top surfaces of both plates.

FIG. 9(a) illustrates a method of processing double layer glass (formed from plates 42 and 48) in which each layer is processed in two locations, but where one pair of filaments 52 and 54 is aligned and another pair of filaments 56 and 58 are offset laterally from each other. Such an arrangement can be obtained by using the method illustrated in FIG. 8, where each plate is processed by a separate laser beam. Alternatively, the filaments may be processed using one of the methods illustrated in FIG. 7.

Figure 9B:
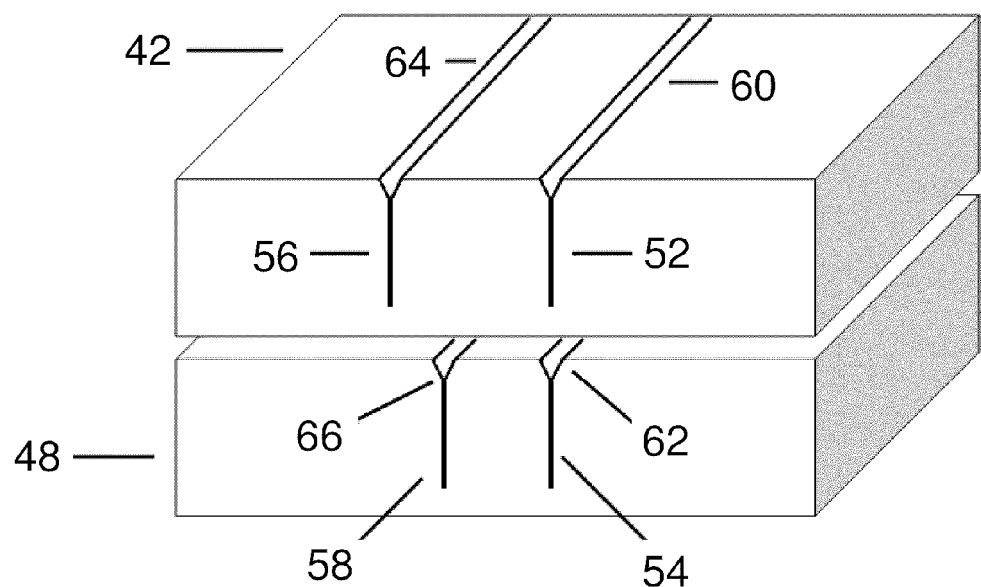
Figure 9C:
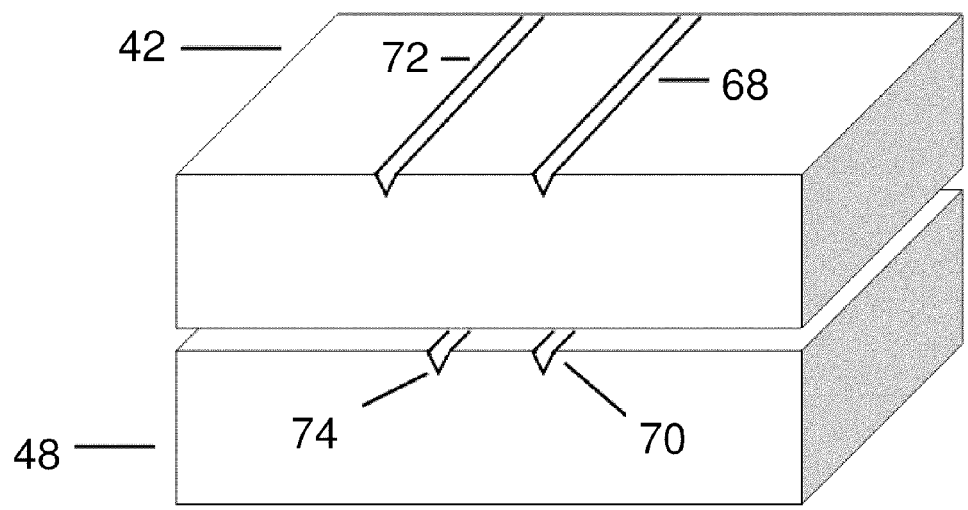

FIG. 9(b) shows a similar arrangement in which a filament is formed in both the upper 42 and 48 plates with groove formation (60, 62, 64 and 66) on the top of each glass, where the method illustrated in FIG. 7 is preferably employed. Similarly, FIG. 9(c) illustrates a case where only V grooves 68, 70, 72 and 74 are developed on the surface of each plate 42 and 48. Note that V groove or filament for the bottom glass can be formed in bottom surface using similar apparatus as shown in FIG. 4 and FIG. 8.

In the context of flat panel displays, it is to be noted that providing a V groove on the top surface of the bottom layer requires the machining of extra connections in the pad area. Furthermore, due to shadow effect of connections, filaments don't form in all places. Nonetheless, the substrate may be cleaved with relative easy without perfect facet view. In some cases, edges may be improved by grinding.

Figure 10:
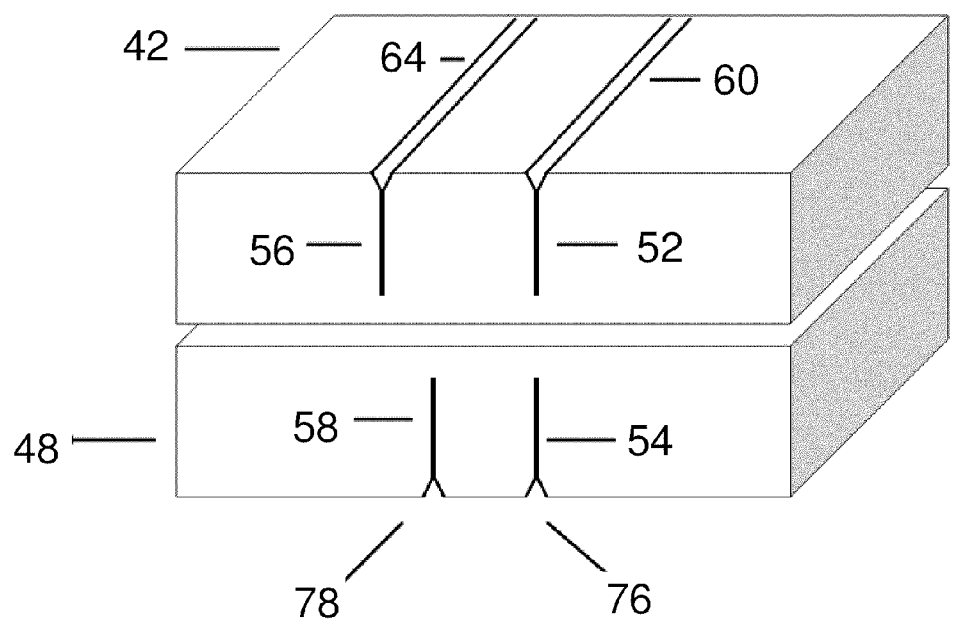
FIG. 10 illustrates scribing laminated glass from top and bottom side with and without offset.

FIG. 10 shows the resulting formation of filaments and V-grooves in double layer glass after scribing using the method as shown in FIG. 8. As described above, the upper plate is scribed from the top and the lower plate is scribed from bottom, where V-grooves 76 and 78 are formed. A V groove, a filament, or a combination thereof (as shown in the Figure) may be formed. As shown, upper and lower filaments may be offset, where the filament 56 and V grove 64 in the upper plate is spatially offset relative to the filament 58 and V groove 78 in the lower plate. Alternatively, upper and lower filaments may be aligned, where the filament 52 and V grove 60 in the upper plate is spatially aligned with filament 54 and V groove 76 in the lower plate. In such a configuration, forming a filament and V groove readily achievable in this configuration, and the scribed regions are efficiently separated during cleaving. Generally speaking, cleaving of top layer is occurs with relative ease, but the inventors have determined that in some cases, the bottom layer warrants careful attention and it may be necessary to properly adjust a cleaving roller prior to the cleaving step. Those skilled in the art will readily appreciate that adjustment may be made by selecting a roller configuration that yields the desired cleave quality.

Figure 11:
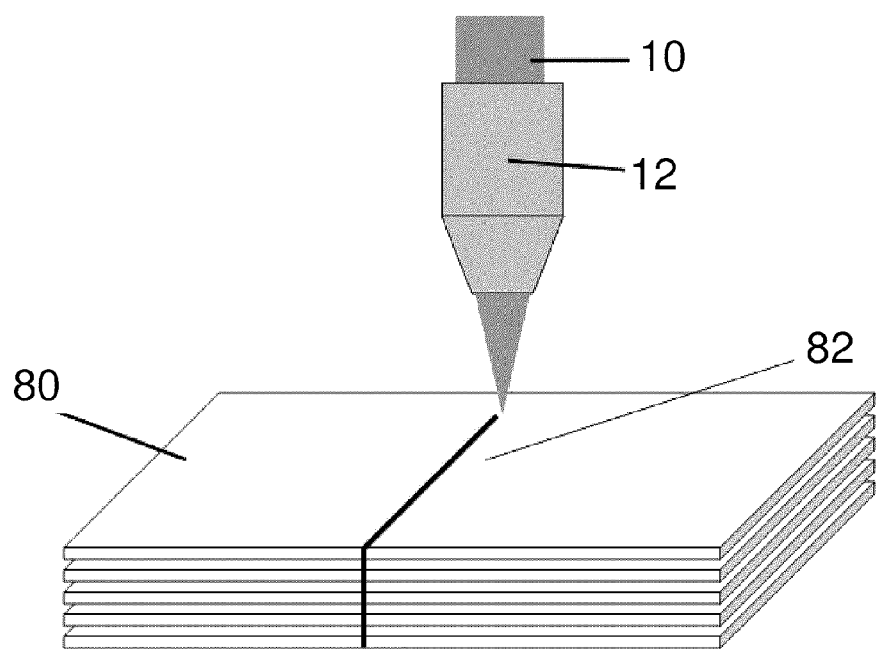
FIG. 11 illustrates a method of laser bursts filament scribing of stacks of very thin substrates.

New approaches in photonics industry involve assemblies of multiple layers of transparent plates that form a stack. For example, touch screen LCDs and 3D LCDs employ three layers of glass. The parallel processing of such a multi-layer stack 80 is shown in FIG. 11, where the scribe line 82 is shown as being provided to each plate in the stack. As shown in FIGS. 7(a) and 7(b), multiple plates in such a stack may be processed by varying the working distance of the objective 12, which enables multiple plates within the stack to be individually scribed. Scribing can be done from both surfaces (similar to the method shown in FIG. 7). Only a top focusing apparatus is shown in the specific case provided here.

The following examples are presented to enable those skilled in the art to understand and to practice the present disclosure. They should not be considered as a limitation on the scope of the embodiments provided herein, but merely as being illustrative and representative thereof.

EXAMPLES

To demonstrate selected embodiments, a glass plate was laser processed using a pulsed laser system with an effective wavelength of about 800 nm, producing 100 fs pulses at a repetition rate of 38 MHz. The laser wavelength was selected to be within the infrared spectral region, where the glass plate is transparent. Focusing optics were selected to provide a beam focus of approximately 10 µm. Initially, the laser system was configured to apply a pulse train of 8 pulses, where the burst of pulses forming the pulse train occurred at a repetition rate of 500 Hz. Various configurations of aforementioned embodiments were employed, as described further below.

FIGS. 12(a)-(c) shows microscope images in a side view of 1 mm thick glass plates viewed through a polished edge facet immediately after laser exposure. The plate was not separated along the filament track for this case in order to view the internal filament structure. As noted above, a single burst of 8 pulses at 38 MHz repetition rate was applied to form each filament track. Furthermore, the burst train was presented at 500 Hz repetition rate while scanning the sample at a moderate speed of 5 mm/s, such that filament tracks were separated into individual tracks with a 10 µm period. The filamentation modification tracks were observed to have a diameter of less than about 3 µm, which is less than the theoretical focal spot size of 10 µm for this focusing arrangement, evidencing the nonlinear self focusing process giving rise to the observed filamentation.

The geometric focus of the laser beam in the sample was varied by the lens-to-sample displacement to illustrate the control over the formation of the filaments within the sample. In FIG. 12(a), the beam focus was positioned near the bottom of the plate, while in FIGS. 12(b) and 12(c), the beam focus was located near the middle and top of the plate, respectively. FIGS. 12(a) and 12(b) show multiple layers of filament tracks (84, 86, 88 and 90) formed through the inside of the glass plate. Notably, the filaments are produced at multiple depths due to defocusing and re-focusing effects as described above.

Figure 12:
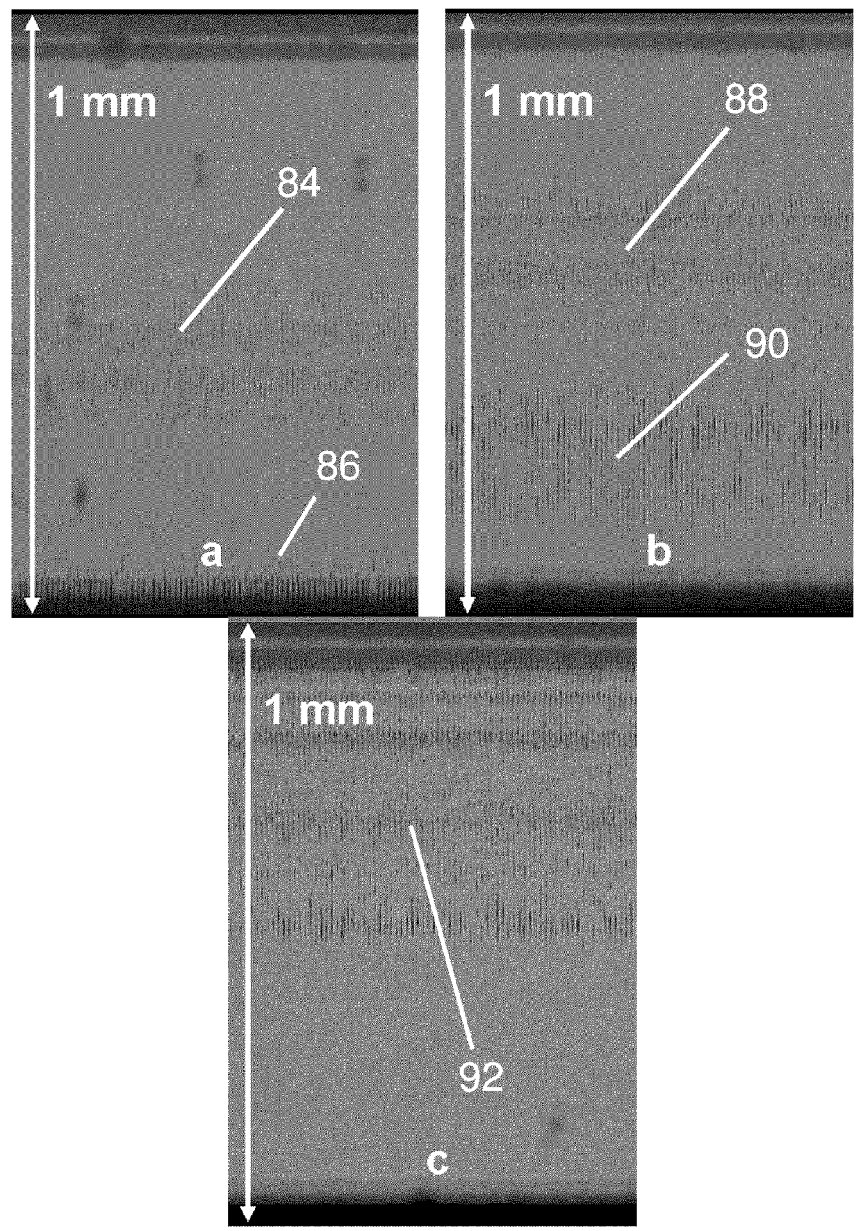
FIG. 12 is an optical microscope image of a glass plate viewed through a polished facet prior to mechanical cleaving, showing laser filamentation tracks formed under identical laser exposure with laser focusing by the lens positioned near the lower (a), middle (b) and top (c) regions of the glass plate.

FIG. 12 thus demonstrates the controlled positioning of the filamentation tracks relative to the surfaces of the plate. In FIG. 12(a), where the beam focus was located near the bottom of the plate, the filaments were formed in the top half of the plate and do not extend across the full thickness of the plate. In FIG. 12(c), where the beam focus was positioned near the top of the plate, relative short filaments 92 of approximately 200 µm are formed in the center of the plate, and top surface ablation and ablation debris are evident. A preferably form for scribing is depicted in FIG. 12(b) where approximately 750

μm long bands of filaments extend through most of the transparent plate thickness without reaching the surfaces. In this domain, ablative machining or other damage was not generated at both of these surfaces.

While the spacing of the filament tracks in FIG. 12 is sufficient to cleave the thick 1 mm glass plate, it was found that moderately high mechanical force was required to cleave the plate along the desired path defined by the filament array. In several tests, it was observed that the glass occasionally cleaved to outside the laser modification track. Therefore, a closer spacing of the filament tracks (i.e. a smaller array pitch) is preferable for cleaving such thick (1 mm) plates.

Those skilled in the art will readily appreciate that suitable values for the array spacing and filament depth will depend on the material type and size of a given plate. For example, two plates of equal thickness but different material composition may have different suitable values for the array spacing and filament depth. Selection of suitable values for a given plate material and thickness may be achieved by varying the array spacing and filament depth to obtain a desired cleave quality and required cleave force.

Referring again to FIG. 12, since the array pitch is 10 μm and the observed filament diameter is approximately 3 microns, only a narrow region is heat affected compared with theoretical laser spot size of 10 μm. In other laser material processing methods, obtaining a small heat affected zone is a challenge. One specific advantage of the present method, as evidenced by the results shown in FIG. 12, is that the width of the heat affected zone on the top and bottom surfaces look the approximately the same. This is an important characteristic of the present method, since the filamentation properties remain substantially confined during formation, which is desirable for accurately cleaving a plate.

FIGS. 13(a) and 13(b) presents optical microscope images focused respectively on the top and bottom surface of the glass sample, as recorded for the sample shown in FIG. 12(b). In between these surfaces, the internal filamentation modification appears unfocused as expected when the modification zone is physically more than 100 μm from either surface due to the limited focal depth of the microscope. The images reveal the complete absence of laser ablation, physical damage or other modification at each of the surfaces while only supporting the internal formation of along laser modification track.

The width of the filamentation modification zone was observed to be about 10 μm when the microscope was focused internally within the glass. This width exceeds the 3-μm modification diameter seen in FIG. 12 for isolated laser filaments and is ascribed to differing zones of narrow high contrast filament tracks (visible in FIG. 12) that have been shrouded in a lower contrast modification zone (not visible in FIG. 12). Without intending to be limited by theory, this low contrast zone that is ascribed to an accumulative modification process (i.e. heat affected zone) is induced by the multiple pulses in the burst.

The filamentation modification zone maintains a near constant 10 μm width through its full depth range of hundred's of microns in the present glass sample that clearly demonstrates the self-focusing phenomenon. Thus, the filamentation modification presents a 10 μm 'internal' kerf width or heat affected zone for such processing. However, the absence of damage or physical changes at the surface indicate that a much smaller or near-zero kerf width is practically available at the surface where one typically only finds other components mounted (paint, electronics, electrodes, packaging, electro-optics, MEMS, sensors, actuators, microfluidics, etc.). Hence, a near-zero kerf width at the surface of transparent substrates or wafers is a significant processing advantage to avoid damage or modification to such components during laser processing. This is one of the important properties of the present disclosure for laser filamentation scribing as the physical modification may be confined inside the bulk transparent medium and away from sensitive components or coatings.

Figure 14A:
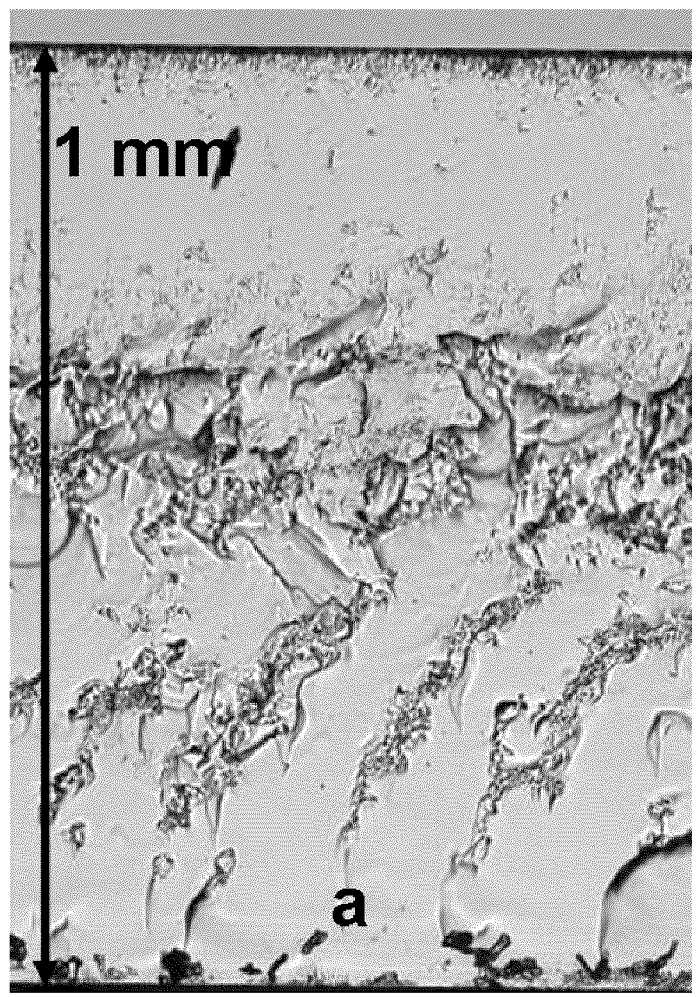
FIG. 14 shows facet edge views of glass plates after mechanical cleaving in which a track of laser filaments was formed at moderate (a) and fast (b) scanning speed during the laser exposure.

To facility cleaving, laser exposure conditions as presented for FIG. 12(b) were applied to a similar 1 mm thick glass sample while using a slower scanning speed to more closely or densely space the filament tracks. Individual filament tracks were no longer resolvable by optical microscopy. FIG. 14(a) shows the end facet view after the sample was mechanically cleaved along the near continuous laser-formed filamentation plane. Under these conditions, only very slight force or pressure is required to induce a mechanical cleave. The cleave accurately follows the filament track and readily propagates the full length of the track to separate the sample. The resulting facet is very flat and with sharply defined edges that are free of debris, chips, and vents.

The optical morphology shows smooth cleavage surfaces interdispersed with rippled structures having feature sizes of tens of microns that are generally smooth and absent of cracks. The smooth facet regions correspond to regions where little or no filamentation tracks were observable in views such as shown in FIG. 12. Sharply defined top and bottom surface edges may be obtained by controlling the laser exposure to confine the filament formation entirely within the glass plate and prevent ablation at the surfaces. The laser filamentation interaction here generates high stress gradients that form along an internal plane or surface shape defined by the laser exposure path. This stress field enables a new means for accurately scribing transparent media in paths controlled by the laser exposure.

Figure 14B:
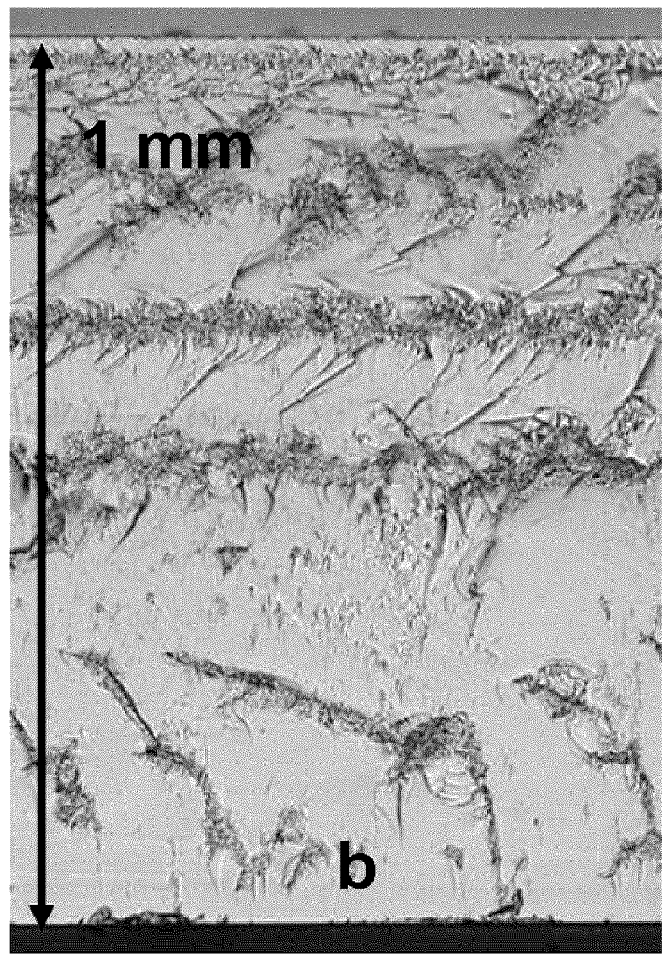

FIG. 14(b) presents a side view optical image of the 1 mm thick glass sample shown in FIG. 12(b) after cleaving. Due to the faster scan speed applied during this laser exposure, less over stress was generated due to the coarse filament spacing (10 μm). As a result, more mechanical force was necessary to separate the plate. The cleaved facet now includes microcracks, vents, and more jagged or coarse morphology than as seen for the case in FIG. 14(a) with slower scanning speed. Such microcracks are less desirable in many applications as the microcracks may seed much large cracks under packaging or subsequent processing steps, or by thermal cycling in the application field that can prematurely damage the operation or lifetime of the device.

Figure 13:
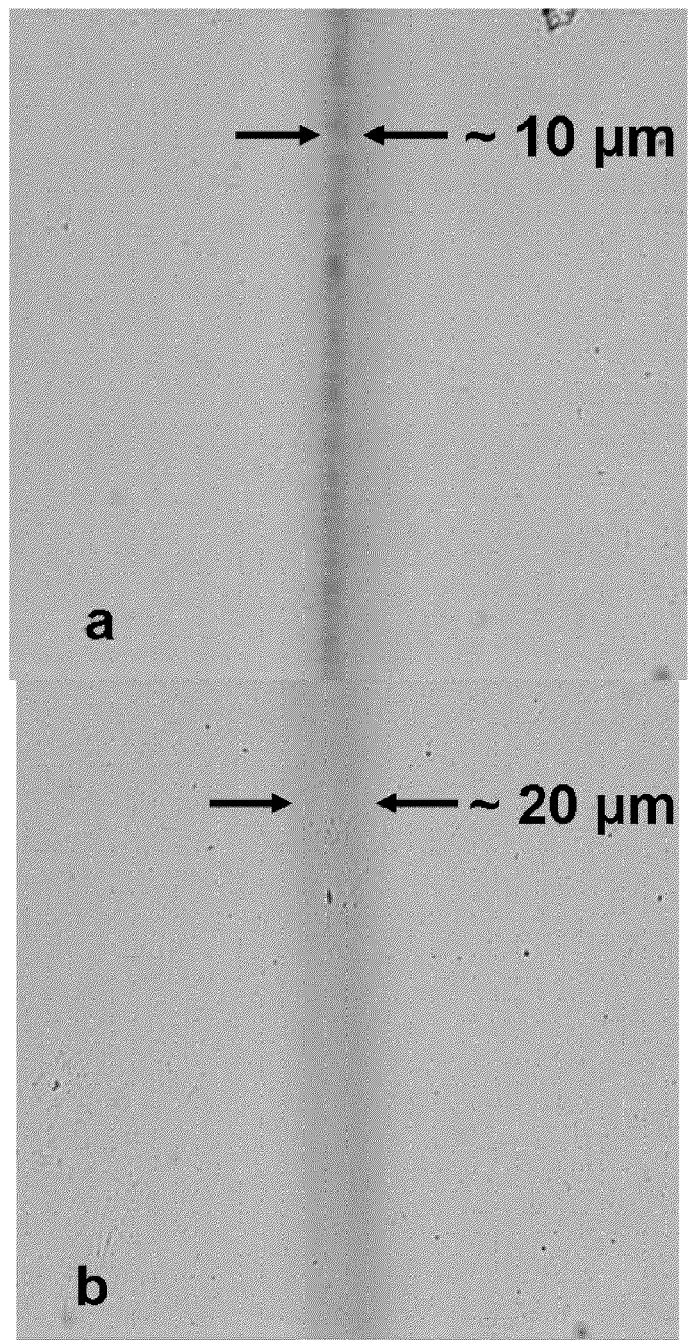
FIG. 13 shows a microscope image of glass imaged at the top (a) and bottom (b) surfaces prior to mechanical cleaving, with a track of laser filaments written inside the bulk glass.

The laser filamentation and scribing examples presented in FIGS. 12-14 for glass clearly demonstrate the aforementioned embodiments in a high-repetition rate method of forming filaments with short pulses lasers is employed. Each filament was formed with a single burst of 8 pulses, with pulses separated by 26 ns and with each pulse having 40-μJ energy. Under such burst conditions, heat accumulation and other transient effects do not dissipate in the short time between pulses, thus enhancing the interaction of subsequent laser pulses with in the filamentation column (plasma channel) of the prior pulse. As such, filaments were formed much more easily, over much longer lengths, and with lower pulse energy, higher reproducibility and improved control than for the case when laser pulses were applied at low repetition rate.

Figure 15:
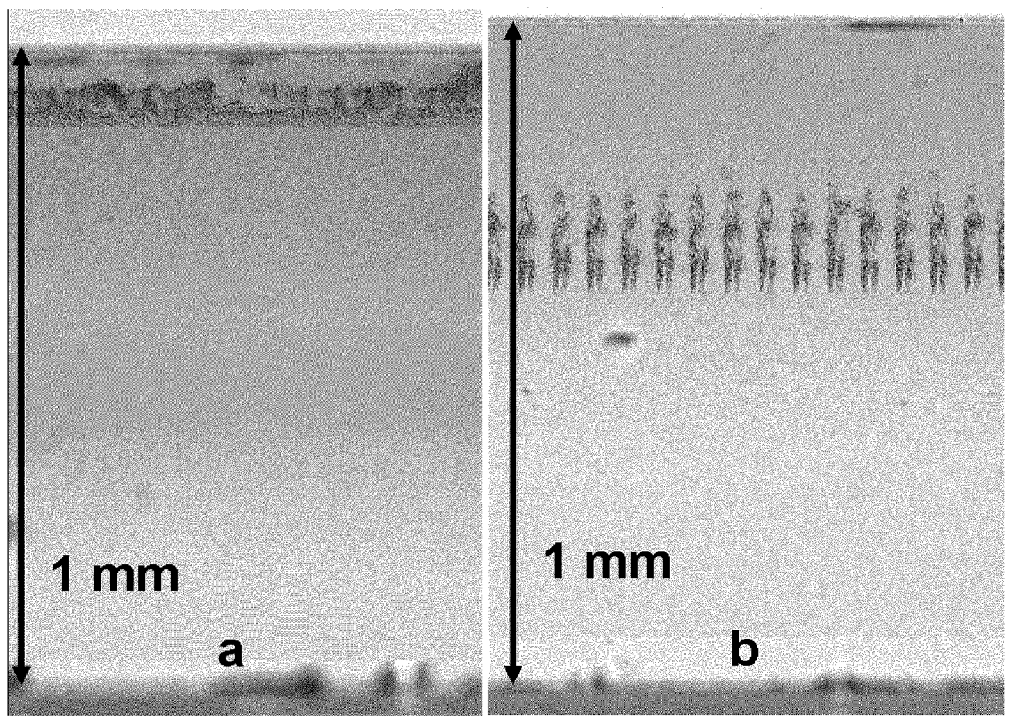
FIG. 15 shows facet edge microscope views comparing the laser modification in 1 mm thick glass formed with an identical number of equal-energy laser pulses applied at (a) low repetition rate, (b) and in single pulse high energy low repetition rate pulse trains. Single pulse has energy of all pulses in one burst train.

FIG. 15(a) shows a microscope image of a cleaved glass plate of 1 mm thickness in which filaments were formed at a low 500 Hz repetition rate (2 ms between laser pulses). The scanning rate was adjusted to deliver 8 pulses per interaction site with each pulse having the same 40 μJ pulse energy as used in the above burst-train examples. The total exposure per single filament was therefore 320 μJ in both cases of burst (FIGS. 12-14) and non-burst (FIG. 15) beam delivery. The long time separation between pulses in the non-burst case (FIG. 15(a)) ensures relaxation of all the material modification dynamics prior to the arrival of the next laser pulse. This precludes any filamentation enhancement effect as heat accumulation and other transient effects are fully relaxed in the long interval between pulses.

Without intending to be limited by theory, the relaxation of material modification dynamics are believed to lead to much weaker overall laser-material interaction in creating filaments and inducing internal modification within the present glass substrate. As a consequence, non-burst laser interactions take place in a very small volume that is near the top glass surface as shown in FIG. 15(a). Further, laser interactions produced small volume cavities inside the glass that can seen in FIG. 15(a) as the rough surface in the top 100 μm of the facet. In order to enable reliable scribing along such laser tracks, it is necessary to pass the laser much more slowly (than the case in FIG. 15(a)) through the sample and/or to apply several repeated passes of the laser over the same track to build up sufficiently strong internal modification.

For direct comparison with burst-train filament writing, FIG. 15(b) shows an edge facet image of a similar glass plate in which filaments were each formed in the low-repetition rate of 500 Hz at 320 μJ energy per pulse (i.e. 320 μJ for burst train: single pulse in the train). Much longer filaments (~180 μm) than in the low-repetition rate 8-pulse exposure of FIG. 15(a) is observed. The filaments are deeply buried within the bulk glass so too avoid surface ablation or other laser damage. Nonetheless, the observed filament length is smaller than that observed for burst filamentation at a similar mean fluence. In both cases of FIGS. 15(a) and 15(b), a common rapid scan speed was applied to provide a broad spacing of the filament array for observational purposes.

Accordingly, these results illustrate that the nature of the filament can be readily manipulated by varying the pulsed nature of the laser exposure. In other words, in addition to the parameters of energy, wavelength, and beam focusing conditions (i.e. numerical aperture, focal position in sample), pulse parameters can be tailored to obtain a desired filament profile. In particular, number of pulses in a pulse burst and the delay time between successive pulses can be varied to control the form of the filaments produced. As noted above, in one embodiment, filaments are produced by providing a burst of pulses for generating each filament, where each burst comprises a series of pulses provided with a relative delay that is less than the timescale for the relaxation of all the material modification dynamics.

In the industrial application of single sheet glass scribing, flat panel glass scribing, silicon and/or sapphire wafer scribing, there is a demand for higher scribing speeds using laser systems with proven reliability. To demonstrate such an embodiment, experiments were performed using a high repetition rate commercial ultrafast laser system having a pulse duration in the picosecond range.

Figure 16A:
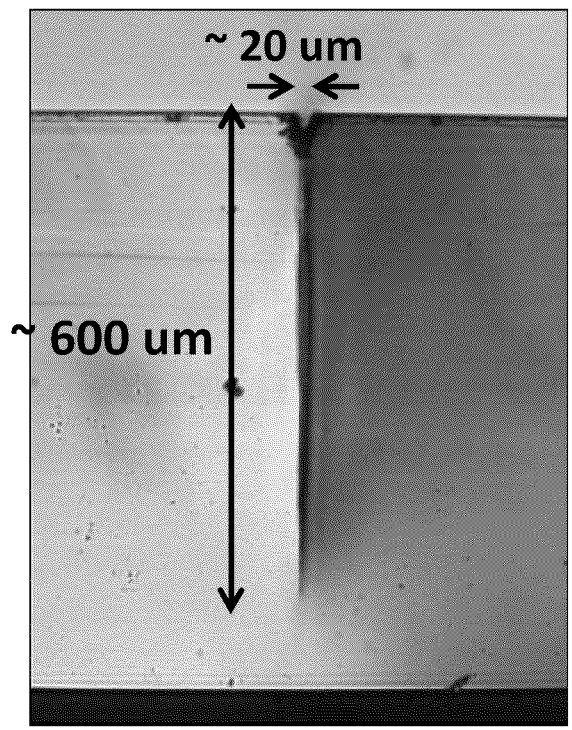
FIG. 16 provides microscope images of scribed glass applying V groove and filament with high repetition rate laser, showing: (a) side view, (b) top view and (c) front view.
Figure 16B:
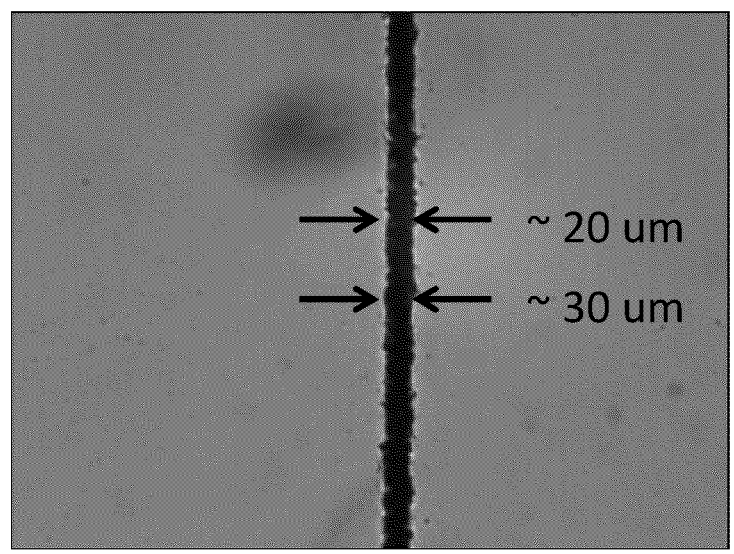
Figure 16C:
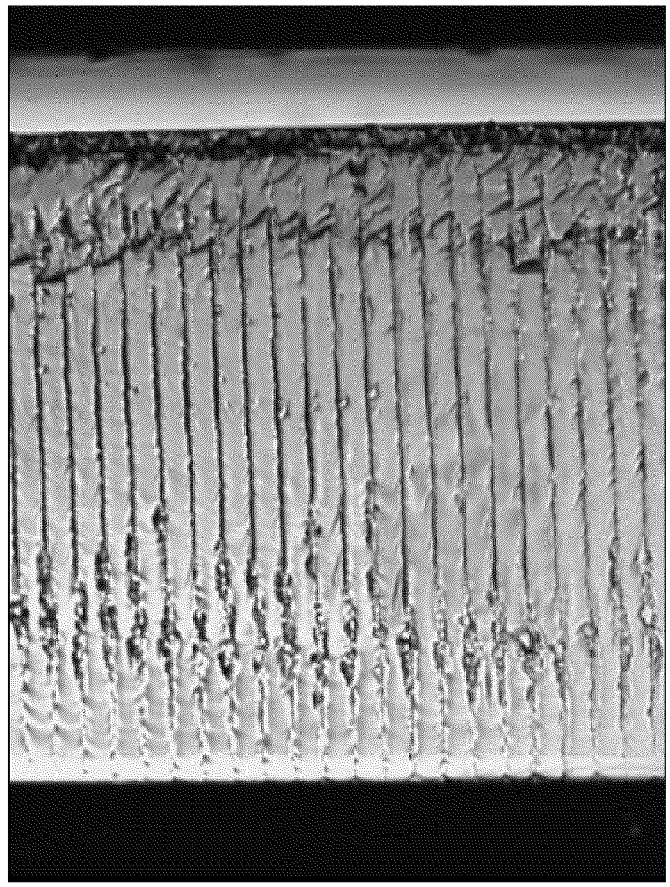

As shown in FIG. 16(a), a V groove with a filament descending from the V groove was produced in a glass substrate having a thickness of 700 microns. The depth and width of the V is about 20 μm and the filament extended to a length of about 600 μm. FIG. 16(b) provides a top view of the glass substrate. The observed kerf width is about 20 μm, covered with about 5 μm recast in the sides. As shown in the Figure, no visible debris is accumulated on the surface. FIG. 16(c) shows a front view of the glass after it is cleaved, highlighting the deep penetration of the filaments into the glass substrate that assist in cleaving the sample.

Figure 17:
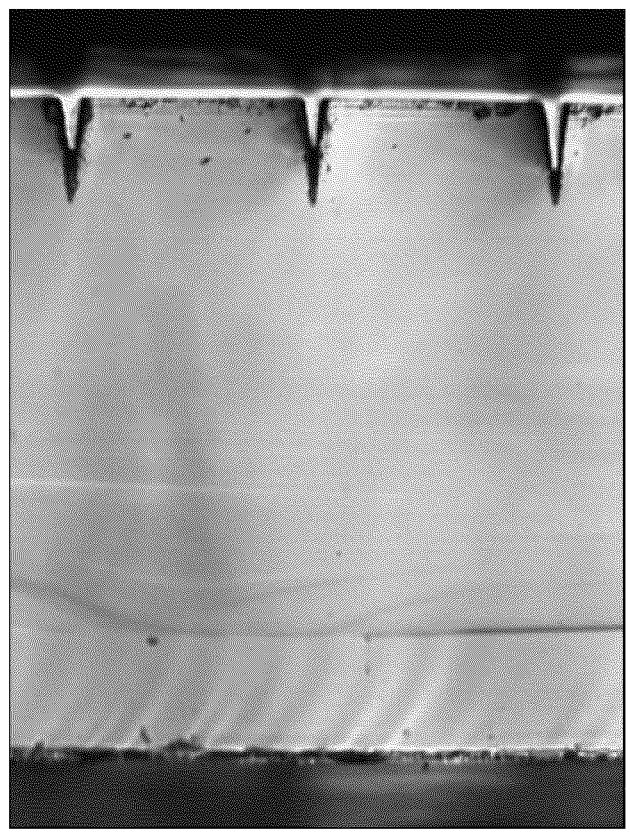
FIG. 17 is a front view of three different V groove formation using high repetition rate laser.

In a subsequent experiment, the focusing condition was changed to minimize the filament length. For some applications, filament formation is not desired, and/or a clean facet is desirable. A side view showing three different V grooves is provided in FIG. 17. Note that the chamfer angle is different for each V. The chamfer angle and depth can be adjusted by changing the focus and beam divergence. The width, depth and sharpness of the V grooves are of high quality comparing to other laser scribing techniques where they generally create wider kerf width or shorter depth structures with grooves having a U-shaped and causing a large amount of debris to accumulate on the surface.

FIG. 18 presents the simultaneous laser filamentation scribing of an assembly of two 400 um thick double layer glasses by the method and arrangement described by FIG. 7(c). A single laser beam was focused into the top glass plate to form a long filament. The laser beam passed through the air gap without creating damage to the two middle glass surfaces. However, self-focusing effects created a second filament to form with the same beam in the second (lower) plate such that two filament tracks were formed separately in each thin glass plate.

Figure 18A:
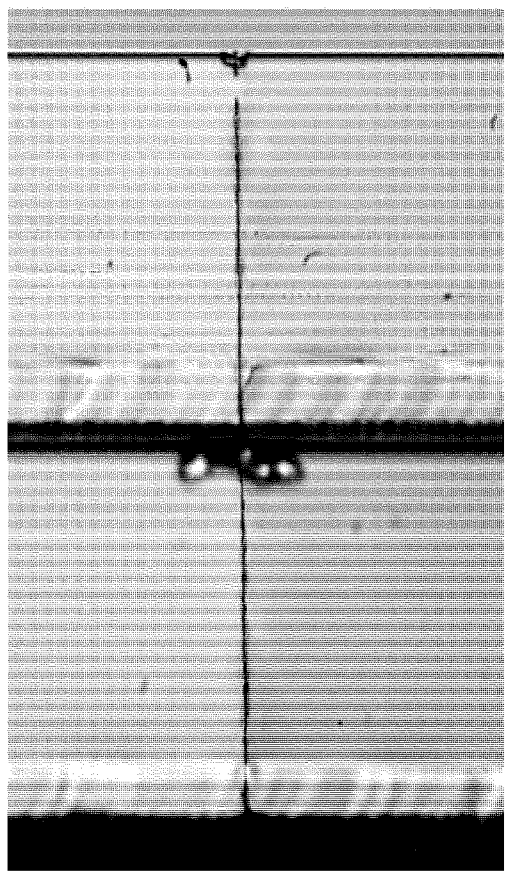
FIG. 18 provides an image showing the scribing of flat panel display glass. Two laminated glass with 400 um thickness are scribed simultaneously; a) side view and b) front view.
Figure 18B:
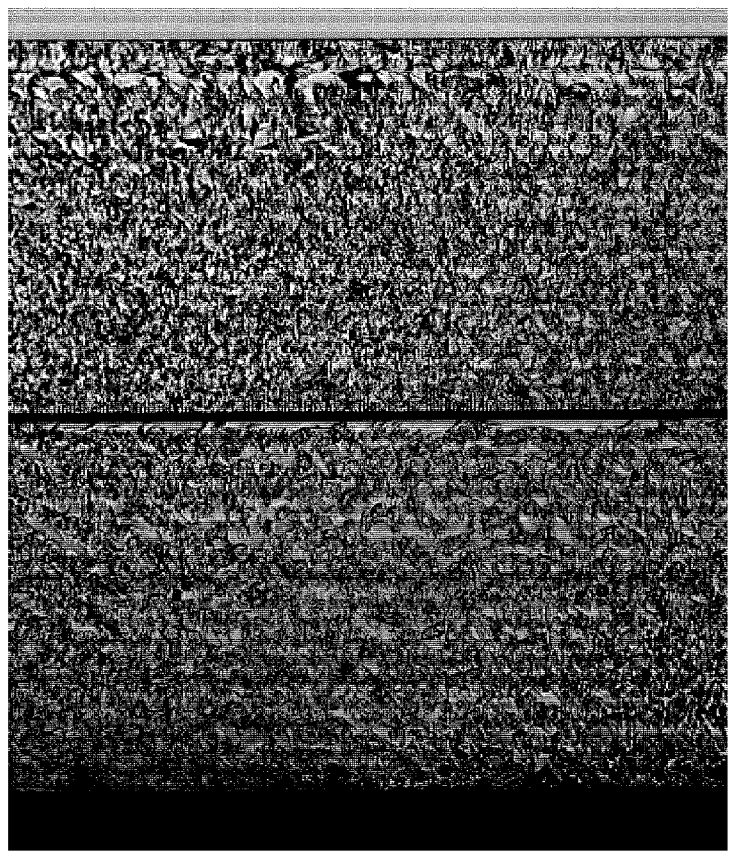

FIG. 18(a) shows a side view of the scribed laminated glass before cleaving and FIG. 18(b) shows optical microscope images of the front surfaces of top and bottom layer glasses after cleaving. The modification tracks are largely confined with in the bulk of the glass, and thus, no ablation debris or microcracks are present in any of the surfaces. The kerf width of the filamentation modification is less than 10 μm in both plates which represents the heat affect zone of the laser. Individual filament tracks are resolvable around which internal stress fields were generated that enabled the mechanical scribing. The facet has clean flat surfaces with only a small degree of contouring around the filament tracks observable. The edges are relatively sharp and absent of microcracks. The facet has the general appearance of a grinded surface, and may be referred to as having been produced by "laser grinding". Such clean and "laser grinded" surfaces may be obtained by creating filaments that are tightly spaced, and preferably, adjacent to each other.

It is to be noted that for each of the optical microscope images in FIGS. 12 to 18, the glass samples are presented as processed by laser exposure without any cleaning steps following the laser exposure or after the cleaving steps.

The present method of low and high (burst) repetition rate filamentation was found to be effective in glass for pulse durations tested in the range of about 30 fs to 10 ps. However, those skilled in the art will appreciate that the preferably pulse duration range for other materials may be different. Those skilled in the art may determine a suitable pulse duration for other materials by varying the pulse duration and examining the characteristics of the filaments produced.

Without intending to be limited by theory, it is believe that embodiments as disclosed herein utilize self-focusing to generate filaments (plasma channels) in transparent materials. Therefore, laser pulse durations in the range of 1 femtosecond to 100 ps are considered the practical operating domain of the present disclosure for generating appropriately high intensity to drive Kerr-lens self focusing in most transparent media.

The present disclosure also anticipates the formation of thermal gradients in the transparent substrate through non-uniform heating by the focused short duration laser light. Such effects may be enhanced by heat accumulation effects when burst-trains of pulses are applied. In this domain, thermal lensing serves as an alternate means for generating a filament or long-focusing channel to produce filament modification tracks in transparent materials for scribing application.

The filamentation modification of transparent media enables rapid and low-damage singulation, dicing, scribing, cleaving, cutting, and facet treatment of transparent materials that are typically in the form of a flat or curved plate, and thus serve in numerous manufacturing applications. The method generally applies to any transparent medium in which a filament may form. For glass materials, this includes dicing or cleaving of liquid crystal display (LCD), flat panel display (FPD), organic display (OLED), glass plates, multilayer thin glass plates, autoglass, tubing, windows, biochips, optical sensors, planar lightwave circuits, optical fibers, drinking glass ware, and art work. For crystals such as silicon, III-V, and other semiconductor materials, particularly, those in thin wafer form, applications include singulation of microelectronic chips, memory chips, sensor chips, light emitting diodes (LED), laser diodes (LD), vertical cavity surface emitting laser (VCSEL) and other optoelectronic devices. This filament process will also apply to dicing, cutting, drilling or scribing of transparent ceramics, polymers, transparent conductors (i.e. ITO), wide bandgap glasses and crystals (such as crystal quartz, diamond, sapphire). The applications also extend to all composite materials and assemblies were at least one material component is transparent to the laser wavelength to facilitate such filamentation processing. Examples include silica on silicon, silicon on glass, metal-coated glass panel display, printed circuit boards, microelectronic chips, optical circuits, multi-layer FPD or LCD, biochips, sensors, actuators, MEMs, micro Total Analysis Systems (µTAS), and multi-layered polymer packaging.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

Therefore what is claimed is:

1. A method of preparing a substrate for cleavage, the method comprising the steps of:
   irradiating the substrate with a burst of pulses of a focused laser beam, wherein the substrate is transparent to the focused laser beam, wherein a time delay between successive pulses in the burst of pulses is less than a time duration over which relaxation of one or more material modification dynamics occurs, and wherein the burst of pulses have an energy and pulse duration selected to produce a filament within the substrate;
   translating the substrate relative to the focused laser beam to irradiate the substrate and produce an additional filament at one or more additional locations;
   wherein the filaments form an array defining an internally scribed path for cleaving the substrate;
   wherein each burst of pulses is focused to provide a sufficient beam intensity within the substrate to cause self-focusing of the focused laser beam over an extended laser interaction focal volume, thereby producing a plasma channel while avoiding optical breakdown, such that substantially uniform modification of the material occurs along the beam path, thereby forming a single continuous filament within the substrate; and
   wherein each single continuous filament is formed with a sufficient length to facilitate cleavage of the substrate without requiring repeat passes of the laser over the same region.

2. The method according to claim 1 wherein the substrate is translated relative to the focused laser beam with a rate selected to produce a filament spacing on a micron scale.

3. The method according to claim 1 wherein the burst of pulses are provided two or more times with a prescribed frequency, and wherein the substrate is translated relative to the focused laser beam with a constant rate.

4. The method according to claim 1 wherein a location of a beam focus of the focused laser beam is selected to generate the filaments within the substrate, wherein at least one surface of the substrate is free from ablation.

5. The method according to claim 1 wherein a location of a beam focus of the focused laser beam is selected to generate a V groove within at least one surface of the substrate.

6. The method according to claim 1 wherein the substrate is a glass.

7. The method according to claim 1 wherein the substrate includes a semiconductor.

8. The method according to claim 1 wherein the substrate is selected from the group consisting of transparent ceramics, polymers, transparent conductors, wide bandgap glasses, crystals, crystal quartz, diamond, and sapphire.

9. The method according to claim 1 wherein the substrate includes a first layer and one or more additional layers, and wherein a location of a beam focus of the focused laser beam is selected to generate filaments within at least one of the one or more additional layers.

10. The method according to claim 9 wherein the substrate includes multi-layer flat panel display glass.

11. The method according to claim 10 wherein the flat panel display glass is selected from the group consisting of liquid crystal display (LCD), flat panel display (FPD), and organic light emitting display (OLED).

12. The method according to claim 9 wherein the substrate is selected from the group consisting of auto glass, tubing, windows, biochips, optical sensors, planar lightwave circuits, optical fibers, drinking glass ware, art glass, silicon, III-V semiconductors, microelectronic chips, memory chips, sensor chips, light emitting diodes (LED), laser diodes (LD), and vertical cavity surface emitting laser (VCSEL).

13. The method according to claim 9, wherein the location of the beam focus of the focused laser beam is selected to generate filaments within two or more layers, wherein the focused laser beam generates a first filament in one layer, propagates into at least one of the one or more additional layers, and generates a second filament in the at least one of the one or more additional layers.

14. The method according to claim 1 further comprising the step of cleaving the substrate.

15. The method according to claim 1 wherein a pulse duration of each pulse is less than about 100 ps.

16. The method according to claim 1 wherein a pulse duration of each pulse is less than about 10 ps.

17. The method according to claim 9 wherein the location of the beam focus of the focused laser beam is first selected to generate filaments within the first layer, the method further comprising the steps of:
   positioning a second beam focus within a second layer, wherein the second layer is one of the one or more additional layers; and
   irradiating the second layer and translating the substrate to produce a second array of filaments defining a second internally scribed path for cleaving the substrate.

18. The method according to claim 17 wherein when irradiating the second layer, the substrate is irradiated from an opposite side relative to when irradiating the first layer.

19. The method according to claim 17 wherein prior to irradiating the second layer, a position of the second beam focus is laterally translated to produce an offset relative to a first position of a first beam focus when irradiating the first layer.

20. The method according to claim 17 wherein a second focused laser beam is used to irradiate the second layer.

21. The method according to claim 1 wherein the pitch of the array is less than or equal to approximately 10 microns.

22. The method according to claim 1 wherein a length of the filaments exceeds approximately 250 microns.

23. The method according to claim 1 wherein a length of the filaments exceeds approximately 600 microns.

24. The method according to claim 1 wherein a diameter of the filament is less than approximately 3 microns.

25. The method according to claim 1 wherein a diameter of the filament is less than approximately 10 microns.

26. The method according to claim 1 wherein, upon cleavage of the substrate, the kerf width is less than approximately 30 microns.

27. The method according to claim 1 wherein the filaments extend over a substantial portion of the substrate.

28. The method according to claim 27 wherein the filaments end without breaking into top or bottom surfaces of the substrate.

29. The method according to claim 27 wherein a location of a beam focus of the focused laser beam is selected to generate a V groove within at least one surface of the substrate.

30. The method according to claim 1 wherein a diffracted beam emerging through a bottom surface of the substrate is converged back onto the bottom surface of the substrate by a focusing element, such that a V groove is produced in the bottom surface of the substrate.

31. The method according to claim 1 wherein upon cleaving the substrate, the edge of the cleaved substrate is substantially free of chipping and microcracks.

* * * * *